(12) United States Patent
Iwakaji et al.

(10) Patent No.: US 12,159,927 B2
(45) Date of Patent: Dec. 3, 2024

(54) SEMICONDUCTOR DEVICE HAVING GATE ELECTRODES ON FRONT SIDE AND BACK SIDE

(71) Applicants: Kabushiki Kaisha Toshiba, Tokyo (JP); Toshiba Electronic Devices & Storage Corporation, Tokyo (JP)

(72) Inventors: Yoko Iwakaji, Tokyo (JP); Tomoko Matsudai, Tokyo (JP); Takeshi Suwa, Kawasaki Kanagawa (JP)

(73) Assignees: Kabushiki Kaisha Toshiba, Tokyo (JP); Toshiba Electronic Devices & Storage Corporation, Tokyo (JP)

(*) Notice: Subject to any disclaimer, the term of this patent is extended or adjusted under 35 U.S.C. 154(b) by 497 days.

(21) Appl. No.: 16/284,053

(22) Filed: Feb. 25, 2019

(65) Prior Publication Data
US 2020/0091323 A1  Mar. 19, 2020

(30) Foreign Application Priority Data
Sep. 19, 2018 (JP) .................. 2018-175439

(51) Int. Cl.
*H01L 29/417* (2006.01)
*H01L 29/08* (2006.01)
(Continued)

(52) U.S. Cl.
CPC ...... *H01L 29/7395* (2013.01); *H01L 29/0804* (2013.01); *H01L 29/0821* (2013.01);
(Continued)

(58) Field of Classification Search
CPC ............ H01L 29/0696; H01L 29/0834; H01L 29/7395; H01L 29/7397; H01L 29/7455;
(Continued)

(56) References Cited

U.S. PATENT DOCUMENTS 4,980,743 A  12/1990 Nakagawa et al.
5,124,773 A * 6/1992 Nakagawa .......... H01L 29/0696
257/138
(Continued)

FOREIGN PATENT DOCUMENTS

EP  0111804 A1  6/1984
JP  59-132666 A  7/1984
(Continued)

*Primary Examiner* — David Chen
(74) *Attorney, Agent, or Firm* — Maier & Maier, PLLC

(57) ABSTRACT

A semiconductor device includes a semiconductor layer having a first plane and a second plane; an emitter electrode on a side of the first plane; at least one collector electrode on a side of the second plane; a first gate electrode on the side of the first plane; at least one second gate electrode on the side of the second plane; a drift region of a first conductivity-type in the semiconductor layer; a collector region of a second conductivity-type in the semiconductor layer; and a first conductivity-type region of the first conductivity-type provided between a part of the collector region and the second plane, wherein the semiconductor device has a first effective gate distance and a second effective gate distance different from the first effective gate distance.

7 Claims, 13 Drawing Sheets

(51) Int. Cl.
  *H01L 29/16* (2006.01)
  *H01L 29/423* (2006.01)
  *H01L 29/739* (2006.01)

(52) U.S. Cl.
  CPC ........ *H01L 29/16* (2013.01); *H01L 29/41708* (2013.01); *H01L 29/42356* (2013.01); *H01L 29/7391* (2013.01)

(58) Field of Classification Search
  CPC ............. H01L 29/1095; H01L 29/7393; H01L 2924/13055; H01L 29/0804; H01L 29/0821; H01L 29/16; H01L 29/41708; H01L 29/42356; H01L 29/66333; H01L 29/7391; H01L 29/747
  USPC ....... 257/135, 136, 137, 138, 140, 143, 147, 257/E29.027, E29.037, E29.125, E29.197, 257/E29.198, E29.214
  See application file for complete search history.

(56) References Cited

U.S. PATENT DOCUMENTS

| | | | | |
|---|---|---|---|---|
| 5,144,401 | A * | 9/1992 | Ogura | H01L 29/749 257/143 |
| 5,483,087 | A * | 1/1996 | Ajit | H01L 29/7455 257/128 |
| 6,054,748 | A * | 4/2000 | Tsukuda | H01L 29/7397 257/E29.066 |
| 2005/0280078 | A1 * | 12/2005 | Teramae | H01L 29/0696 438/270 |
| 2014/0037528 | A1 | 2/2014 | Neumann et al. | |
| 2015/0155277 | A1 * | 6/2015 | Ogura | H01L 29/861 257/140 |
| 2015/0214299 | A1 | 7/2015 | Blanchard | |
| 2016/0064484 | A1 * | 3/2016 | Harame | H01L 27/12 257/163 |
| 2016/0181409 | A1 * | 6/2016 | Alexander | H01L 29/732 257/125 |
| 2017/0047922 | A1 * | 2/2017 | Alexander | H01L 29/42304 |
| 2018/0083129 | A1 * | 3/2018 | Kitagawa | H01L 29/7397 |

FOREIGN PATENT DOCUMENTS

| | | |
|---|---|---|
| JP | S64-57674 A | 3/1989 |
| JP | 05190835 A | 7/1993 |
| JP | H08-021713 B2 | 3/1996 |
| JP | 3111725 B2 | 11/2000 |
| JP | 3124611 B2 | 1/2001 |
| JP | 3278497 B2 | 4/2002 |
| JP | 2003-158269 A | 5/2003 |
| JP | 2008-053610 A | 3/2008 |
| JP | 2010-251517 A | 11/2010 |
| JP | 2017-509141 A | 3/2017 |

* cited by examiner

SEMICONDUCTOR DEVICE HAVING GATE ELECTRODES ON FRONT SIDE AND BACK SIDE

CROSS-REFERENCE TO RELATED APPLICATION

This application is based upon and claims the benefit of priority from Japanese Patent Application No. 2018-175439, filed on Sep. 19, 2018, the entire contents of which are incorporated herein by reference.

FIELD

Embodiments described herein relate generally to a semiconductor device.

BACKGROUND

As an example of a power semiconductor device, there is an insulated gate bipolar transistor (IGBT). For example, the IGBT is provided with a p-type collector region, an n-type drift region, and a p-type base region on a collector electrode. The IGBT is also provided with a gate electrode above the p-type base region with a gate insulating film interposed between the gate electrode and the p-type base region. The IGBT is further provided with an n-type emitter region connected to an emitter electrode on the front face of the p-type base region.

In the IGBT, a positive voltage higher than a threshold voltage is applied to the gate electrode to form a channel in the p-type base region. Electrons are injected from the n-type emitter region into the n-type drift region, and positive holes are injected from the p-type collector region into the n-type drift region. Accordingly, electric current is flown with the electrons and the positive holes as carriers between the collector electrode and the emitter electrode.

Various attempts have been made to improve the IGBT characteristics, such as decreasing an on-resistance, decreasing a turn-off power loss, and decreasing a surge voltage. For example, to decrease a turn-off power loss of the IGBT, it has been proposed that a gate electrode be provided on the collector electrode side as well. At the time of turn-off of the IGBT, a voltage higher than the threshold voltage is applied to the gate electrode to suppress injection of positive holes from the collector electrode and shorten the turn-off time, thereby a turn-off power loss can be decreased.

DETAILED DESCRIPTION

Embodiments of the present disclosure will be described below with reference to the drawings. In the following descriptions, the same or similar parts and others may be given the same reference signs, and descriptions of the already described parts and others may be omitted as appropriate.

The expressions $n^+$ type, n type, and $n^-$ type herein mean that the n-type impurity concentration becomes lower in the order of $n^+$ type, n type, and $n^-$ type. The expressions $p^+$ type, p type, and $p^-$ type herein means that the p-type impurity concentration becomes lower in the order of $p^+$ type, p type, and $p^-$ type.

First Embodiment

A semiconductor device in a first embodiment includes a semiconductor layer having a first plane and a second plane, the second plane being opposed to the first plane; an emitter electrode provided on a side of the first plane of the semiconductor layer; at least one collector electrode provided on a side of the second plane of the semiconductor layer; a first gate electrode provided on the side of the first plane of the semiconductor layer; at least one second gate electrode provided on the side of the second plane of the semiconductor layer; a drift region of a first conductivity-type provided in the semiconductor layer; a collector region of a second conductivity-type provided in the semiconductor layer, the collector region provided between a part of the drift region and the second plane, a part of the collector region opposed to the at least one second gate electrode, and a part of the collector region being in contact with the at least one collector electrode; and a first conductivity-type region of the first conductivity-type provided in the semiconductor layer, the first conductivity-type region provided between a part of the collector region and the second plane, a part of the first conductivity-type region being opposed to the at least one second gate electrode, and a part of the first conductivity-type region being in contact with the at least one collector electrode. When a portion of contact between the at least one collector electrode and the collector region is defined as a contact face, a point that exists in a line segment on the contact face connecting a first point positioned on the contact face and a closest second gate electrode among the at least one gate electrode and is most distant from the at least one second gate electrode is defined as a second point, and a distance between the second point and a second gate electrode closest to the second point among the at least one second gate electrode is defined as an effective gate distance, the semiconductor device has a first effective gate distance and a second effective gate distance different from the first effective gate distance.

Figure 1:
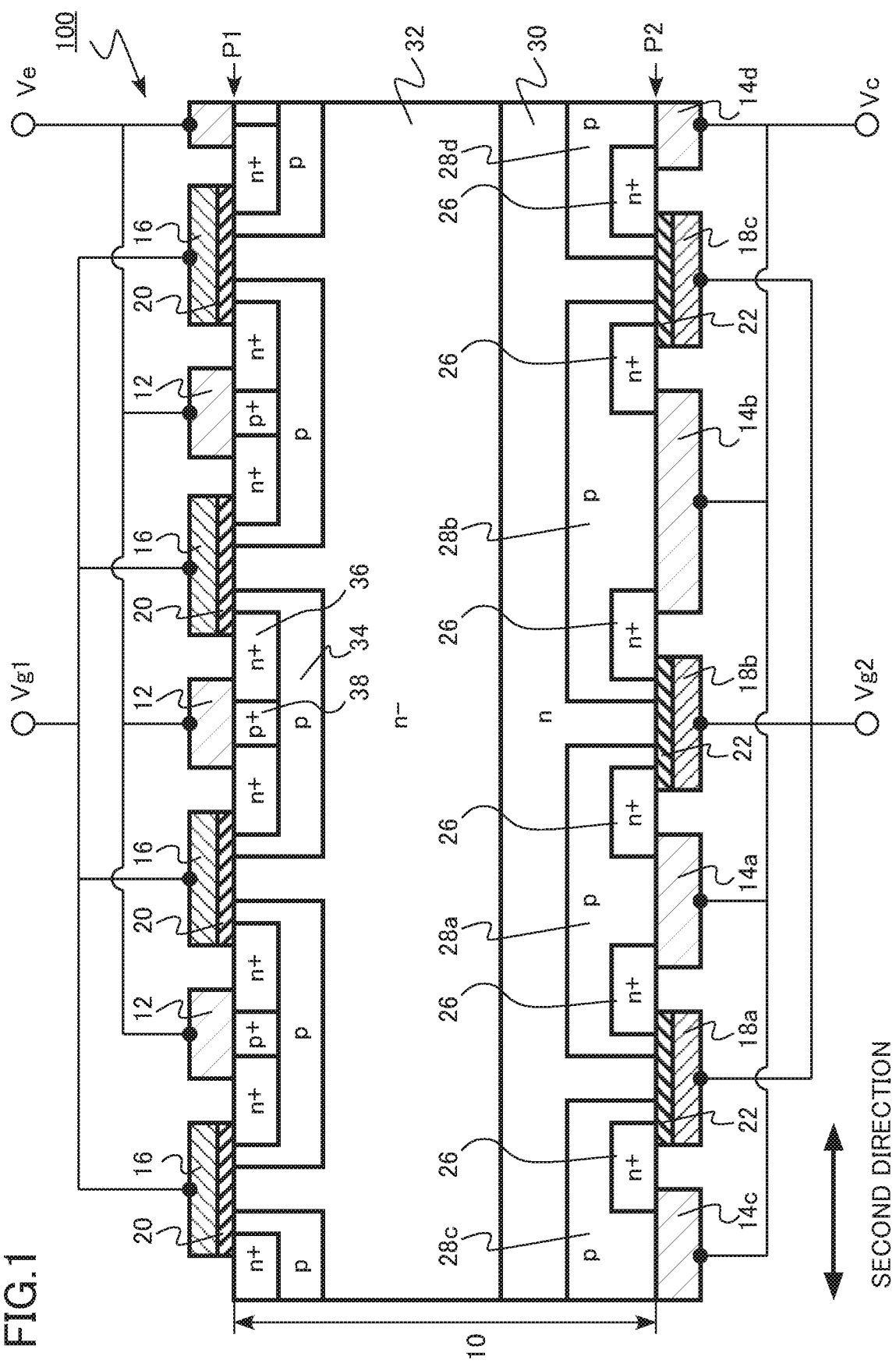
FIG. 1 is a schematic partial cross-sectional view of a semiconductor device in a first embodiment.
Figure 2:
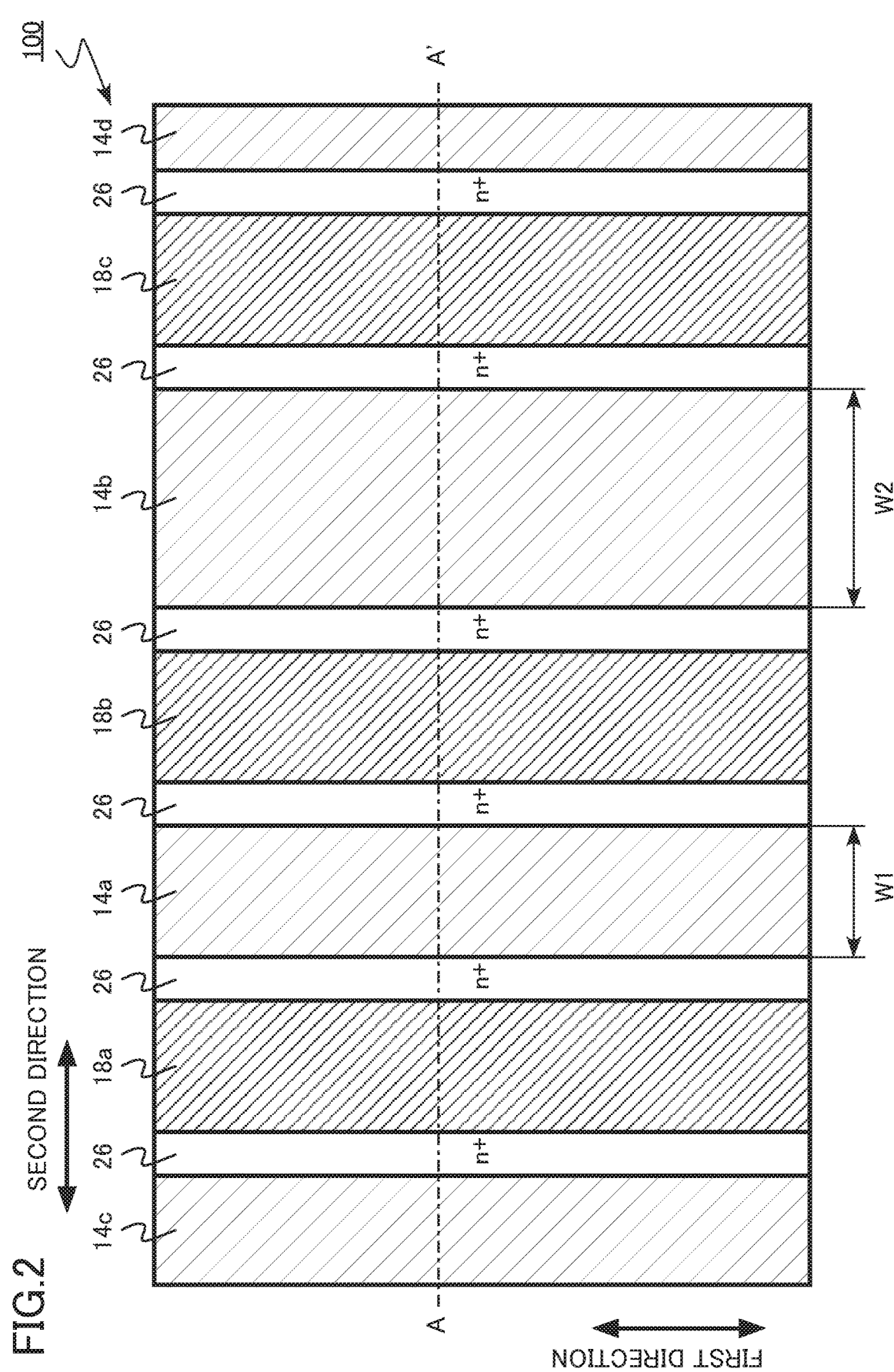
FIG. 2 is a schematic partial planar view of a second plane side of the semiconductor device in the first embodiment.

FIG. 1 is a schematic partial cross-sectional view of a semiconductor device in the first embodiment. FIG. 2 is a schematic partial planar view of a second plane side of the semiconductor device in the first embodiment. FIG. 1 is a cross-sectional view of FIG. 2 taken along line AA'. The AA' cross section is perpendicular to the second plane. Hereinafter, descriptions will be given as to a case in which the first-conductivity type is n type and the second-conductivity type is a p type as an example.

The semiconductor device in the first embodiment is a planar gate-type IGBT 100 that includes a main gate electrode on the front side of a semiconductor layer. The IGBT 100 includes control gate electrodes on the back side of the semiconductor layer.

The IGBT 100 in the first embodiment includes a semiconductor layer 10, an emitter electrode 12, a collector electrode 14a, a collector electrode 14b, a collector electrode 14c, a collector electrode 14d, a main gate electrode 16 (first gate electrode), a control gate electrode 18a (second gate electrode), a control gate electrode 18b (second gate electrode), a control gate electrode 18c (second gate electrode), a first gate insulating film 20, and a second gate insulating film 22.

Provided in the semiconductor layer 10 are an n-type back-side drain region 26 (first conductivity-type region), a p-type collector region 28a, a p-type collector region 28b, a p-type collector region 28c, a p-type collector region 28d, an n-type buffer region 30, an n⁻-type drift region 32, a p-type base region 34, an n⁺-type emitter region 36, and a p⁺-type contact region 38.

Hereinafter, the plurality of collector electrodes included in the IGBT 100 will be also collectively called collector electrodes 14. Hereinafter, the plurality of control gate electrodes included in the IGBT 100 will be also collectively called control gate electrodes 18. Hereinafter, the plurality of collector regions included in the IGBT 100 will be also collectively called collector regions 28.

The semiconductor layer 10 has a first plane P1 and a second plane P2 opposed to the first plane P1. The first plane P1 constitutes the front side of the semiconductor layer 10 and the second plane P2 constitutes the back side of the semiconductor layer 10. The semiconductor layer 10 is made of a single crystal silicon, for example. The thickness of the semiconductor layer 10 is 40 to 700 µm inclusive, for example.

The emitter electrode 12 is provided on the first plane P1 side of the semiconductor layer 10. At least a part of the emitter electrode 12 is in contact with the first plane P1 of the semiconductor layer 10. The emitter electrode 12 is made of metal, for example. An emitter voltage (Ve) may be applied to the emitter electrode 12. The emitter voltage is 0 V, for example.

The collector electrode 14a, the collector electrode 14b, the collector electrode 14c, and the collector electrode 14d are provided on the second plane P2 side of the semiconductor layer 10. At least a part of each of the collector electrodes 14 is in contact with the second plane P2 of the semiconductor layer 10. The collector electrodes 14 are made of metal, for example.

The collector electrodes 14 are electrically connected together. A collector voltage (Vc) may be applied to the collector electrodes 14. The collector voltage is 200 to 6500 V inclusive, for example.

The main gate electrode 16 is provided on the first plane P1 side of the semiconductor layer 10. The main gate electrode 16 is made of polycrystalline silicon including n-type impurities or p-type impurities, for example. A first gate voltage (Vg1) may be applied to the main gate electrode 16.

The first gate insulating film 20 is provided between the main gate electrode 16 and the semiconductor layer 10. The first gate insulating film 20 is a silicon oxide film, for example.

The control gate electrode 18a, the control gate electrode 18b, and the control gate electrode 18c are provided on the second plane P2 side of the semiconductor layer 10. The control gate electrodes 18 are made of polycrystalline silicon including n-type impurities or p-type impurities, for example.

The control gate electrodes 18 are electrically connected together. A second gate voltage (Vg2) may be applied to the control gate electrodes 18.

The second gate insulating film 22 is provided between the control gate electrodes 18 and the semiconductor layer 10. The second gate insulating film 22 is a silicon oxide film, for example.

The p-type collector region 28a, the p-type collector region 28b, the p-type collector region 28c, and the p-type collector region 28d are each provided between a part of the drift region 32 and the second plane P2. A part of the collector regions 28 are in contact with the second plane P2.

A part of each of the collector regions 28 is opposed to the control gate electrodes 18 with the second gate insulating film 22 between the collector regions 28 and the control gate electrodes 18. Channels of back-side transistors controlled by the control gate electrodes 18 are formed in the collector regions 28 opposed to the control gate electrodes 18.

The collector regions 28 are electrically connected to the collector electrodes 14. A part of each of the collector regions 28 is in contact with one of the collector electrodes 14.

The n-type back-side drain region 26 is provided between a part of each of the collector regions 28 and the second plane P2. A part of the back-side drain region 26 is opposed to one of the control gate electrodes 18 with the second gate insulating film 22 between the back-side drain region 26 and the one of the control gate electrodes 18.

A part of the n-type back-side drain region 26 is in contact with one of the collector electrodes 14. The n-type back-side drain region 26 acts as a drain of the back-side transistors.

The n-type buffer region 30 is provided between the first plane P1 and the collector regions 28. The buffer region 30 is provided between the drift region 32 and the second plane P2. The buffer region 30 is opposed to the control gate electrodes 18 with the second gate insulating film 22 interposed between the buffer region 30 and the control gate electrodes 18.

The n-type impurity concentration in the buffer region 30 is higher than the n-type impurity concentration in the drift region 32.

The buffer region 30 has a function of suppressing the extension of a depletion layer while the IGBT 100 is in the off state. The portions of the buffer region 30 opposed to the control gate electrodes 18 act as sources of the back-side transistors. The buffer region 30 can be eliminated.

The n⁻-type drift region 32 is provided between the buffer region 30 and the first plane P1. The n-type impurity concentration in the drift region 32 is lower than the n-type impurity concentration in the buffer region 30.

The drift region 32 constitutes a path of an on-current while the IGBT 100 is in the on state. The drift region 32 has a function of becoming depleted and maintaining the breakdown voltage of the IGBT 100 while the IGBT 100 is in the off state.

The p-type base region 34 is provided between the first plane P1 and the drift region 32. A part of the base region 34 is opposed to the main gate electrode 16 with the first gate insulating film 20 interposed between the base region 34 and the main gate electrode 16. A channel of a main transistor controlled by the main gate electrode 16 is formed in the base region 34 opposed to the main gate electrode 16.

The n-type emitter region 36 is provided between the first plane P1 and the base region 34. The emitter region 36 is electrically connected to the emitter electrode 12. A part of the emitter region 36 is in contact with the emitter electrode 12. The emitter region 36 constitutes a supply source of electrons while the IGBT 100 is in the on state.

The $p^+$-type contact region 38 is provided between the first plane P1 and the base region 34. The contact region 38 is electrically connected to the emitter electrode 12.

FIG. 2 is a planar view of the second plane P2 side of the IGBT 100. As illustrated in FIG. 2, the collector electrodes 14 and the control gate electrodes 18 extend in a first direction. The collector electrodes 14 and the control gate electrodes 18 are alternately disposed in a second direction.

For example, the collector electrode 14a is sandwiched between the control gate electrode 18a and the control gate electrode 18b. The collector electrode 14a is in contact with the back-side drain region 26 at both ends in the second direction. The back-side transistors are provided on the both sides of the collector electrode 14a.

For example, the collector electrode 14b is sandwiched between the control gate electrode 18b and the control gate electrode 18c. The collector electrode 14b is in contact with the back-side drain region 26 at both ends in the second direction. The back-side transistors are provided on the both sides of the collector electrode 14b.

The collector electrodes 14 included in the IGBT 100 have two or more different widths. For example, a width W1 of the collector electrode 14a in the second direction is smaller than a width W2 of the collector electrode 14b in the second direction. The collector electrode 14a and the collector electrode 14b have different widths in the AA' cross section perpendicular to the second plane P2.

The IGBT 100 have two or more different effective gate distances. In other words, the IGBT 100 have a first effective gate distance and a second effective gate distance different from the first effective gate distance. The effective gate distance of the collector electrode 14 is defined as described below.

The portion of contact between the collector electrode 14 and the collector region 28 is defined as a contact face. In addition, a point that exists in a line segment on the contact face connecting a first point on the contact face and the closest control gate electrode 18 (second gate electrode) and is most distant from the control gate electrode 18 is defined as a second point. The distance between the second point and the control gate electrode 18 closest to the second point is defined as an effective gate distance.

In other words, out of the points existing in the line segment, the point with the maximum value of the shortest distance to the control gate electrode 18 is defined as the second point. The foregoing maximum value is defined as the effective gate distance.

The second point is defined with consideration given to the distance between the second point and only the control gate electrode 18 that has a portion opposed to the collector region 28 where the first point exists.

Figure 3:
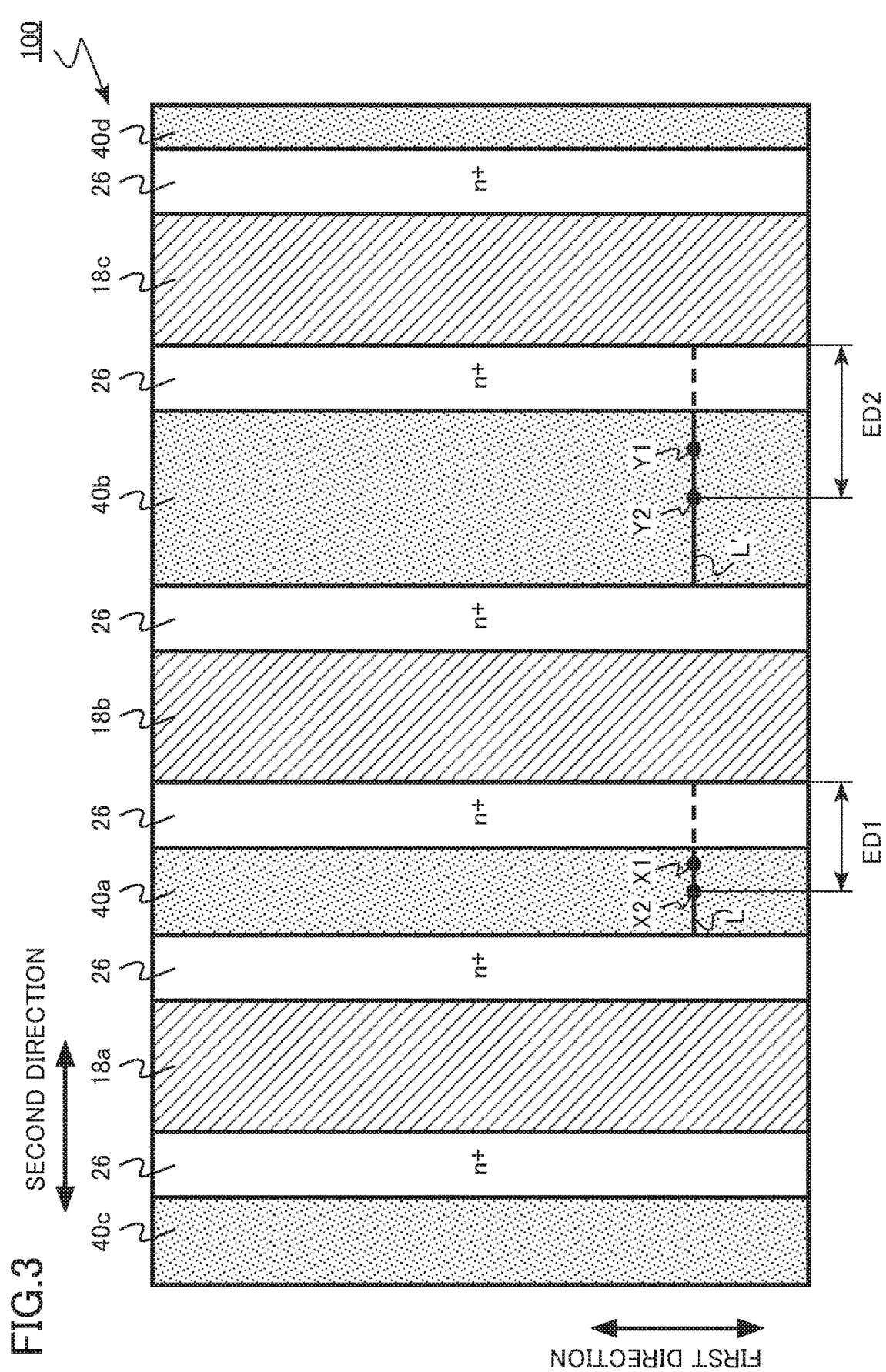
FIG. 3 is an illustrative diagram of effective gate distances of a collector electrode in the semiconductor device in the first embodiment.

FIG. 3 is an illustrative diagram of effective gate distances of the collector electrodes in the semiconductor device in the first embodiment. FIG. 3 is a schematic partial planar view of the second plane side of the semiconductor device in the first embodiment. FIG. 3 is a planar view with the collector electrodes 14 excluded from FIG. 2.

The IGBT 100 has a contact face 40a, a contact face 40b, a contact face 40c, and a contact face 40d. For example, the portion of contact between the collector electrode 14a and the collector region 28a constitutes the contact face 40a, and the portion of contact between the collector electrode 14a and the collector region 28 constitutes the contact face 40b.

For example, an effective gate distance ED1 is determined as described below. A point that exists in a line segment L on the contact face 40a connecting a first point X1 positioned on the contact face 40a and the closest control gate electrode 18b and is most distant from both the control gate electrode 18a and the control gate electrode 18b is defined as a second point X2. The distance ED1 between the second point X2 and the closest control gate electrode 18b is defined as effective gate distance ED1. In this case, the distance between the second point X2 and the control gate electrode 18a is also equal to the distance ED1.

For example, an effective gate distance ED2 is determined as described below. A point that exists in a line segment L' on the contact face 40b connecting a first point Y1 positioned on the contact face 40b and the closest control gate electrode 18c and is most distant from the control gate electrode 18b and the control gate electrode 18c is defined as a second point Y2. The distance ED2 between the second point Y2 and the closest control gate electrode 18c is defined as effective gate distance ED2. In this case, the distance between the second point Y2 and the control gate electrode 18b is also equal to the distance ED2.

The effective gate distance ED1 of the collector electrode 14a is different from the effective gate distance ED2 of the collector electrode 14b. The effective gate distance ED1 is smaller than the effective gate distance ED2.

Next, operations of the IGBT 100 will be described.

While the IGBT 100 is in the off state, the emitter voltage (Ve) is applied to the emitter electrode 12. The emitter voltage is 0 V, for example. A collector voltage (Vc) is applied to the collector electrodes 14. The collector voltage is 200 to 6500 V inclusive, for example.

To turn on the IGBT 100, a turn-on voltage is applied as a first gate voltage (Vg1) to the main gate electrode 16. The turn-on voltage is a positive voltage that exceeds a threshold voltage of the main transistor that has the main gate electrode 16 as a gate electrode. The turn-on voltage is 15 V, for example.

When the turn-on voltage is applied to the main gate electrode 16, an n-type inversion layer is formed in the p-type base region 34 near the interface with the first gate insulating film 20 and electrons are injected from the $n^+$-type emitter region 36 through the n-type inversion layer into the $n^-$-type drift region 32. The electrons injected into the $n^-$-type drift region 32 forwardly bias pn junctions formed by the n-type buffer region 30 and the p-type collector regions 28. The electrons reach the collector electrodes 14 and cause injection of holes from the p-type collector regions 28. Accordingly, the IGBT 100 is turned on.

When the IGBT 100 is in the on state, the collector voltage (Vc) is applied as the second gate voltage (Vg2) to the control gate electrodes 18. The back-side transistors with the control gate electrodes 18 as gate electrodes are turned into the off state.

Next, to turn off the IGBT 100, a turn-off voltage is applied as the first gate voltage (Vg1) to the main gate electrode 16. The turn-off voltage is a voltage equal to or lower than the threshold voltage under which the main transistor is not turned on, which is 0 V, for example.

When the turn-off voltage is applied to the main gate electrode 16, the n-type inversion layer in the p-type base region 34 near the interface with the first gate insulating film 20 disappears and the injection of electrons from the n$^+$-type emitter region 36 to the n$^-$-type drift region 32 is stopped. Accordingly, the IGBT 100 moves to the off state.

Concurrently with or after a lapse of time from the application of the turn-off voltage to the main gate electrode 16, a voltage is applied as the second gate voltage (Vg2) to the control gate electrodes 18 to turn on the back-side transistors. In other words, a positive voltage equal to or higher than the threshold voltage is applied to the control gate electrodes 18 so that an n-type inversion layer is formed in the p-type collector regions 28 near the interface with the second gate insulating film 22.

When the n-type inversion layer is formed in the p-type collector regions 28 near the interface with the second gate insulating film 22, there is formed a path of electrons to be passed from the n-type buffer region 30 through the n-type inversion layer and the n-type back-side drain region 26 and discharged to the collector electrodes 14. That is, there occurs a short-circuit between the n-type buffer region 30 and the collector electrodes 14, that is, an anode short-circuit.

With the occurrence of the anode short-circuit, it is possible to prevent the electrons from passing from the n-type buffer region 30 through the p-type collector regions 28 to the collector electrodes 14 and suppress the injection of holes from the p-type collector regions 28 to the drift region 32. Suppressing the injection of holes at the turning off of the IGBT 100 makes it possible to reduce a tail current at the time of turn-off. Therefore, the turn-off time of the IGBT 100 becomes short. Accordingly, the turn-off power loss of the IGBT 100 is decreased.

Next, functions and effects of the semiconductor device in the first embodiment will be described.

As described above, the IGBT 100 of the first embodiment is provided with the back-side transistors to suppress the injection of holes into the n$^-$-type drift region 32 at the time of turn-off. Suppressing the injection of holes decreases turn-off power loss. However, completely shutting off the injection of holes may rapidly promote the depletion of the n$^-$-type drift region 32 from the second plane P2 side. In this case, punch-through may occur in the depletion layer extending from the first plane P1 side and the depletion layer extending from the second plane P2 side, generating a large surge voltage.

In the IGBT 100 in the first embodiment, the collector electrodes 14 have two or more different effective gate distances. For example, at the portion of the collector electrode 14 with a short effective gate distance, the electrons to pass from the n-type buffer region 30 through the p-type collector region 28 to the collector electrode 14 are completely shut off to cause no injection of holes into the n$^-$-type drift region 32.

On the other hand, at the portion of the collector electrode 14 with a long effective gate distance, in a region distant from the control gate electrode 18 in the p-type collector region 28, a path of electrons to pass from the n-type buffer region 30 through the p-type collector region 28 and reach the collector electrode 14 is not completely shut off. Therefore, in this region, the injection of holes into the n$^-$-type drift region 32 is not stopped.

Leaving part of the region where holes are injected into the n$^-$-type drift region 32 suppresses the depletion of the n$^-$-type drift region 32 and the occurrence of a surge voltage. Therefore, according to the IGBT 100 in the first embodiment, it is possible to achieve both the reduction of a turn-off power loss and the suppression of occurrence of a surge voltage. Adjusting the two or more effective gate distances of the collector electrodes 14 makes it easy to achieve both the reduction of a turn-off power loss and the suppression of occurrence of a surge voltage.

Further, in the IGBT 100 in the first embodiment, the collector electrodes 14 are provided on not the entire surface but the partial surface of the second plane P2. Therefore, while the IGBT 100 is in the on state, it is possible to suppress passage of electrons through the collector electrodes 14 and reduce the on-resistance of the IGBT 100.

In the IGBT 100, it is preferred to, after a lapse of time from the application of the turn-off voltage to the main gate electrode 16, apply a voltage to the control gate electrodes 18 to turn on the back-side transistors. Making the temporal difference makes it possible to delay the depletion of the n$^-$-type drift region from the second plane P2 side with respect to the depletion of the n$^-$-type drift region from the first plane P1 side. Therefore, the occurrence of a surge voltage is further suppressed. From the viewpoint of suppressing the occurrence of a surge voltage, the temporal difference is preferably 100 ns or more.

In the IGBT 100, to achieve both the reduction of a turn-off power loss and the suppression of occurrence of a surge voltage, the second effective gate distance of the collector electrode 14 is preferably 1.1 to 10 times, more preferably 1.5 to five times longer than the first effective gate distance of the collector electrode 14.

As described above, according to the IGBT in the first embodiment, it is possible to achieve both the reduction of turn-off power loss of the IGBT and the suppression of occurrence of a surge voltage. Further, it is possible to reduce the on-resistance of the IGBT.

Second Embodiment

A semiconductor device in a second embodiment is different from the first embodiment in that collector electrodes are physically connected together. Descriptions of features of the second embodiment overlapping those of the first embodiment may be partially omitted.

Figure 4:
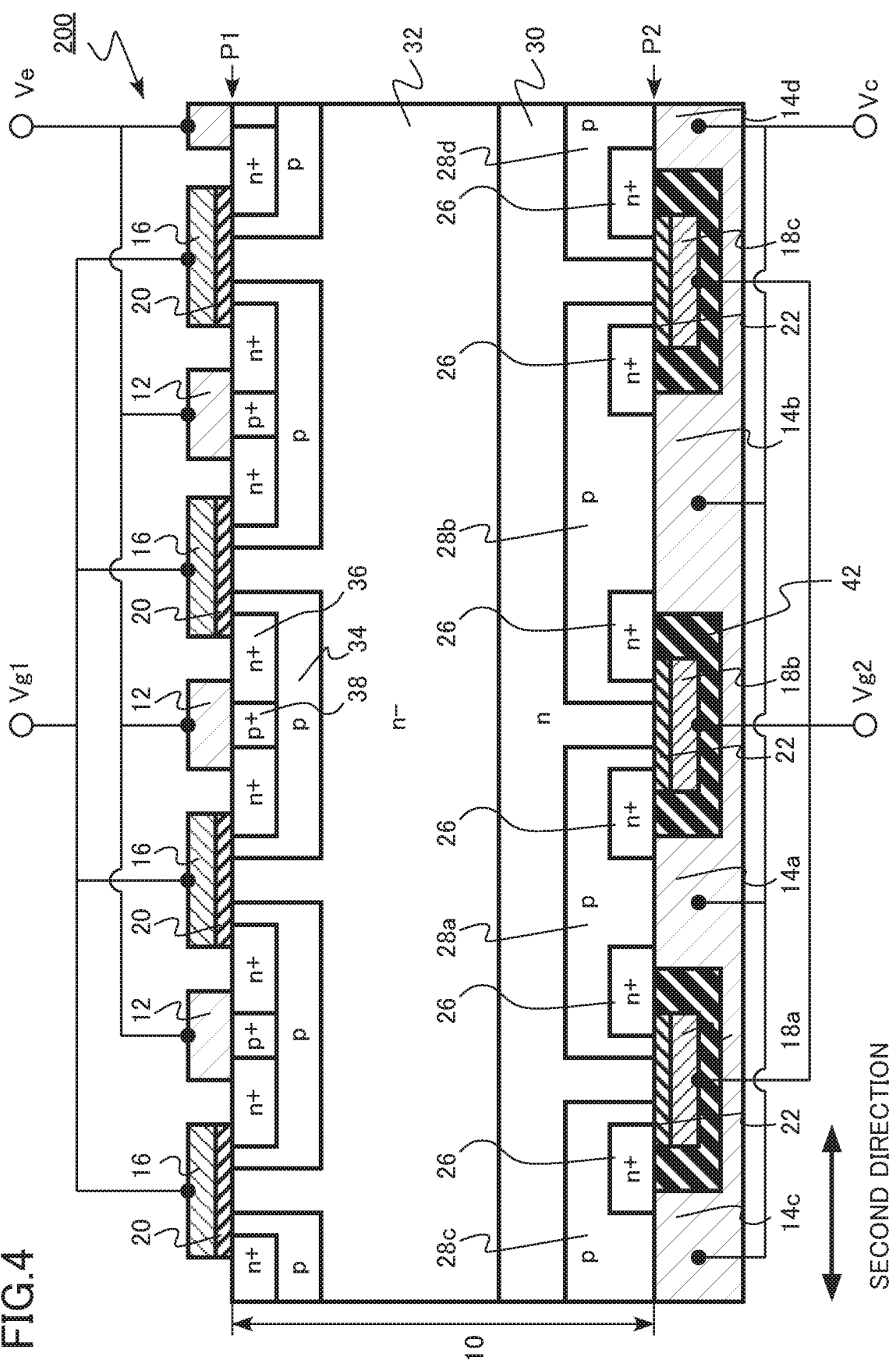
FIG. 4 is a schematic partial cross-sectional view of a semiconductor device in a second embodiment.

FIG. 4 is a schematic partial cross-sectional view of the semiconductor device in the second embodiment.

The semiconductor device in the second embodiment is a planar gate-type IGBT 200 that includes a main gate electrode on the front side of a semiconductor layer. The IGBT 200 includes control gate electrodes on the back side of the semiconductor layer.

The IGBT 200 in the second embodiment includes a semiconductor layer 10, an emitter electrode 12, a collector electrode 14*a*, a collector electrode 14*b*, a collector electrode 14*c*, a collector electrode 14*d*, a main gate electrode 16 (first gate electrode), a control gate electrode 18*a* (second gate electrode), a control gate electrode 18*b* (second gate electrode), a control gate electrode 18*c* (second gate electrode), a first gate insulating film 20, a second gate insulating film 22, and a separation insulating film 42.

Provided in the semiconductor layer 10 are an n-type back-side drain region 26 (region), a p-type collector region 28*a*, a p-type collector region 28*b*, a p-type collector region 28c, a p-type collector region 28d, an n-type buffer region 30, an n⁻-type drift region 32, a p-type base region 34, an n⁺-type emitter region 36, and a p⁺-type contact region 38.

Hereinafter, the plurality of collector electrodes included in the IGBT 200 will be also collectively called collector electrodes 14. Hereinafter, the plurality of control gate electrodes included in the IGBT 200 will be also collectively called control gate electrodes 18. Hereinafter, the plurality of collector regions included in the IGBT 200 will be also collectively called collector regions 28.

The separation insulating film 42 is provided between the control gate electrodes 18 and the collector electrodes 14. The collector electrode 14a, the collector electrode 14b, the collector electrode 14c, and the collector electrode 14d are physically connected together. The separation insulating film 42 is made of oxide silicon, for example.

For example, the separation insulating film 42 is formed with openings through which the second plane P2 is exposed. Depositing the collector electrodes 14 in the openings and on the separation insulating film 42 forms the physically connected collector electrodes 14.

According to the IGBT in the second embodiment, as with the IGBT in the first embodiment, it is possible to achieve both the reduction of a turn-off power loss of the IGBT and the suppression of occurrence of a surge voltage. In addition, it is possible to reduce the on-resistance of the IGBT.

Third Embodiment

A semiconductor device in a third embodiment is different from the first embodiment in that a second gate electrode is provided on only one side of collector electrodes. Descriptions of features of the second embodiment overlapping those of the first embodiment may be partially omitted.

Figure 5:
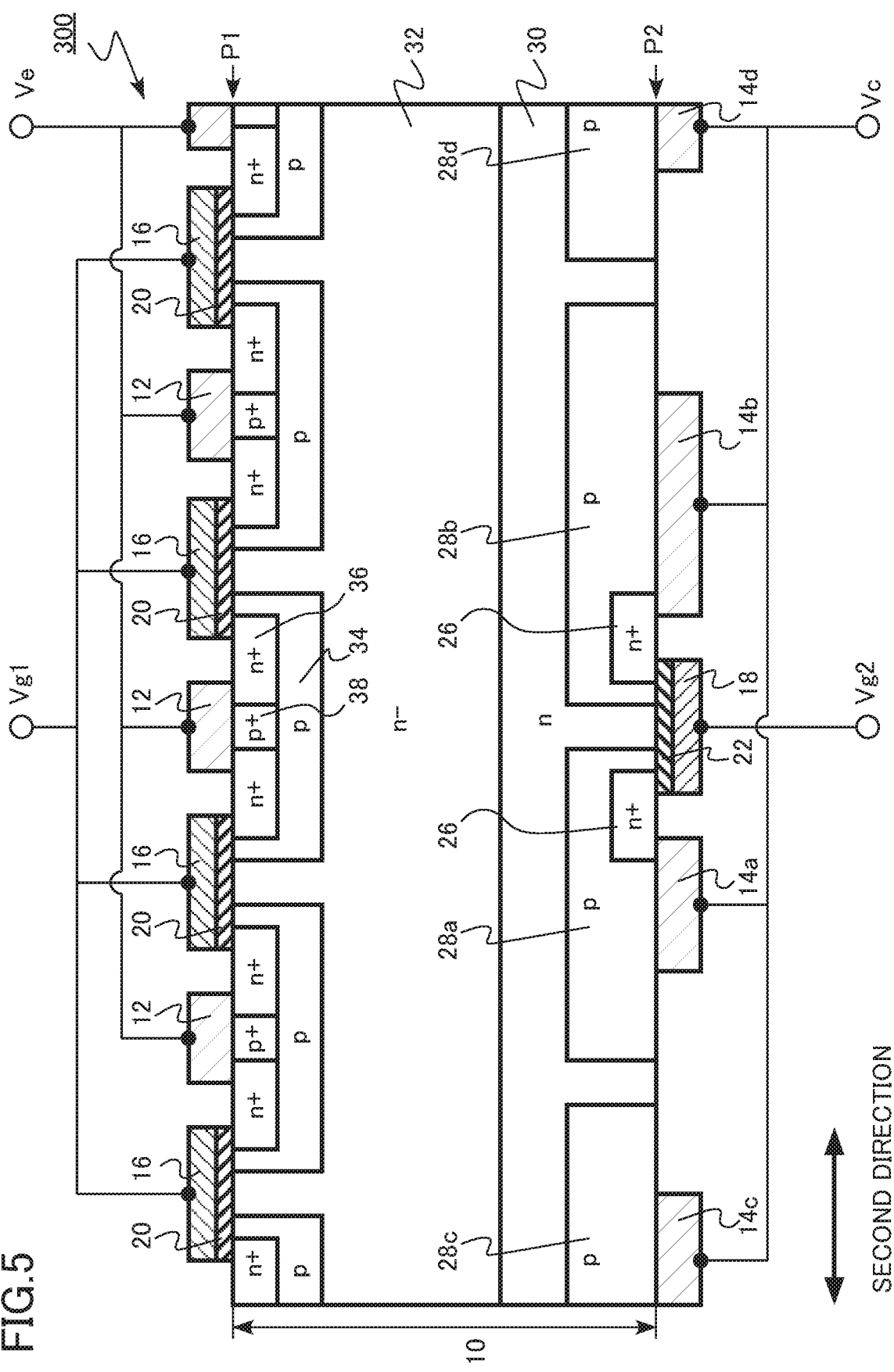
FIG. 5 is a schematic partial cross-sectional view of a semiconductor device in a third embodiment.
Figure 6:
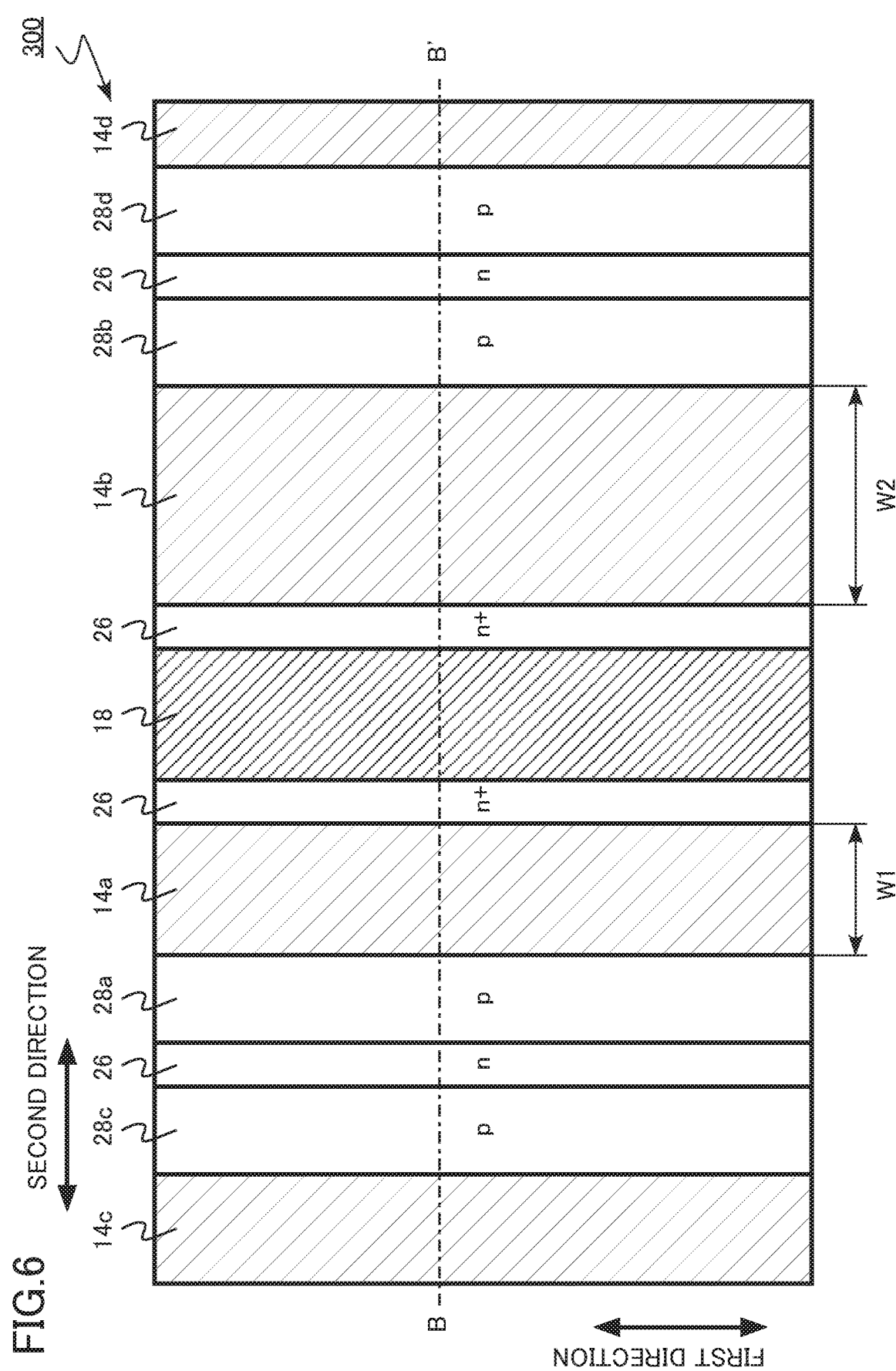
FIG. 6 is a schematic partial planar view of a second plane side of the semiconductor device in the third embodiment.

FIG. 5 is a schematic partial cross-sectional view of the semiconductor device in the third embodiment. FIG. 6 is a schematic partial planar view of a second plane side of the semiconductor device in the third embodiment. FIG. 5 is a cross-sectional view of FIG. 6 taken along line BB'. The BB' cross section is a cross section perpendicular to the second plane. Hereinafter, descriptions will be given as to a case in which the first-conductivity type is n type and the second-conductivity type is a p type as an example.

The semiconductor device in the third embodiment is a planar gate-type IGBT 300 that includes a main gate electrode on the front side of a semiconductor layer. The IGBT 300 includes control gate electrodes on the back side of the semiconductor layer.

The IGBT 300 in the third embodiment includes a semiconductor layer 10, an emitter electrode 12, a collector electrode 14a, a collector electrode 14b, a collector electrode 14c, a collector electrode 14d, a main gate electrode 16 (first gate electrode), a control gate electrode 18 (second gate electrode), a first gate insulating film 20, and a second gate insulating film 22.

Provided in the semiconductor layer 10 are an n-type back-side drain region 26 (first conductivity-type region), a p-type collector region 28a, a p-type collector region 28b, a p-type collector region 28c, a p-type collector region 28d, an n-type buffer region 30, an n⁻-type drift region 32, a p-type base region 34, an n⁺-type emitter region 36, and a p⁺-type contact region 38.

Hereinafter, the plurality of collector electrodes included in the IGBT 300 will be also collectively called collector electrodes 14. Hereinafter, the plurality of collector regions included in the IGBT 300 will be also collectively called collector regions 28.

In the IGBT 300, the control gate electrode 18 is provided on only one side of the collector electrodes 14 in the second direction. For example, the collector electrode 14a is in contact with the back-side drain region 26 at only one end in the second direction. A back-side transistor is provided on only one side of the collector electrode 14a. For example, the collector electrode 14b is in contact with the n-type back-side drain region 26 at only one end as seen in the second direction. A back-side transistor is provided on only one side of the collector electrode 14b.

The p-type collector region 28a and the p-type collector region 28c may be in contact with each other. The p-type collector region 28b and the p-type collector region 28d may be in contact with each other.

The collector electrodes 14 included in the IGBT 300 have two or more different widths, for example. For example, a width W1 of the collector electrode 14a in the second direction is smaller than a width W2 of the collector electrode 14b in the second direction. The collector electrode 14a and the collector electrode 14b have different widths in the BB' cross section vertical to the second plane P2.

The IGBT 300 have two or more different effective gate distances, for example. In other words, The IGBT 300 have a first effective gate distance and a second effective gate distance different from the first effective gate distance.

Figure 7:
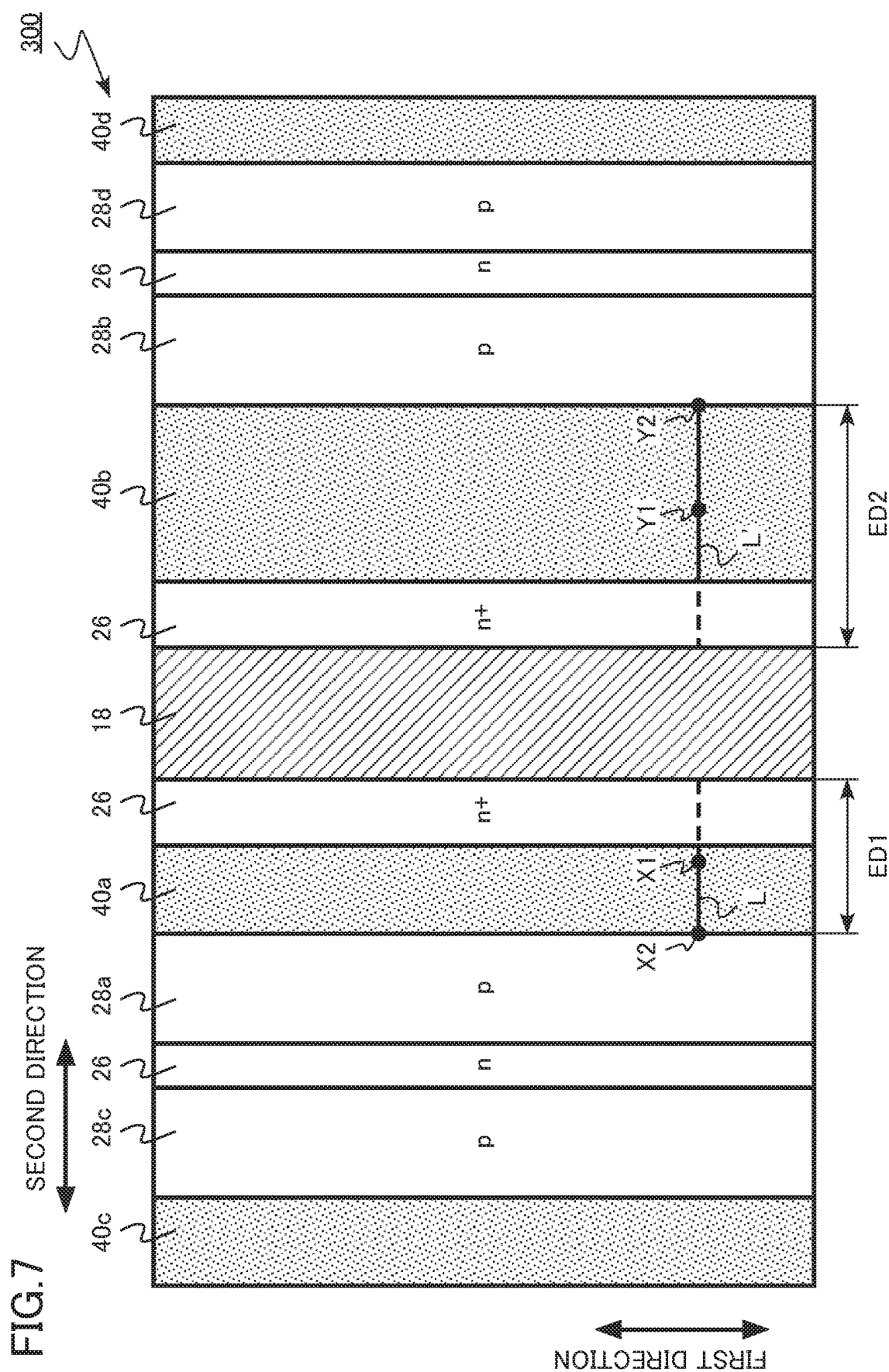
FIG. 7 is an illustrative diagram of effective gate distances of collector electrodes in the semiconductor device in the third embodiment.

FIG. 7 is an illustrative diagram of effective gate distances of the collector electrodes in the semiconductor device in the third embodiment. FIG. 7 is a schematic partial planar view of a second plane side of the semiconductor device in the third embodiment. FIG. 7 is a planar view with the collector electrodes 14 excluded from FIG. 6.

The IGBT 300 has a contact face 40a, a contact face 40b, a contact face 40c, and a contact face 40d. For example, the portion of contact between the collector electrode 14a and the collector region 28a constitutes the contact face 40a, and the portion of contact between the collector electrode 14a and the collector region 28 constitutes the contact face 40b.

For example, an effective gate distance ED1 is determined as described below. A point that exists in a line segment L on the contact face 40a connecting a first point X1 positioned on the contact face 40a and the closest control gate electrode 18 and is most distant from the control gate electrode 18 is defined as a second point X2. The distance ED1 between the second point X2 and the closest control gate electrode 18 is defined as the effective gate distance ED1. In this case, the second point X2 is located at the end of the contact face 40a on the side opposite to the control gate electrode 18.

For example, an effective gate distance ED2 is determined as described below. A point that exists in a line segment L' on the contact face 40b connecting a first point Y1 positioned on the contact face 40b and the closest control gate electrode 18 and is most distant from the control gate electrode 18 is defined as a second point Y2. The distance ED2 between the second point Y2 and the closest control gate electrode 18 is defined as the effective gate distance ED2. In this case, the second point Y2 is located at the end of the contact face 40b on the side opposite to the control gate electrode 18.

The effective gate distance ED1 is different from the effective gate distance ED2. The effective gate distance ED1 is smaller than the effective gate distance ED2.

According to the IGBT in the third embodiment, as with the IGBT in the first embodiment, it is possible to achieve both the reduction of a turn-off power loss of the IGBT and the suppression of occurrence of a surge voltage. In addition, it is possible to reduce the on-resistance of the IGBT.

Fourth Embodiment

A semiconductor device in a fourth embodiment is different from the first embodiment in that second gate electrodes are in a circular shape. Descriptions of features of the second embodiment overlapping those of the first embodiment may be partially omitted.

Figure 8:
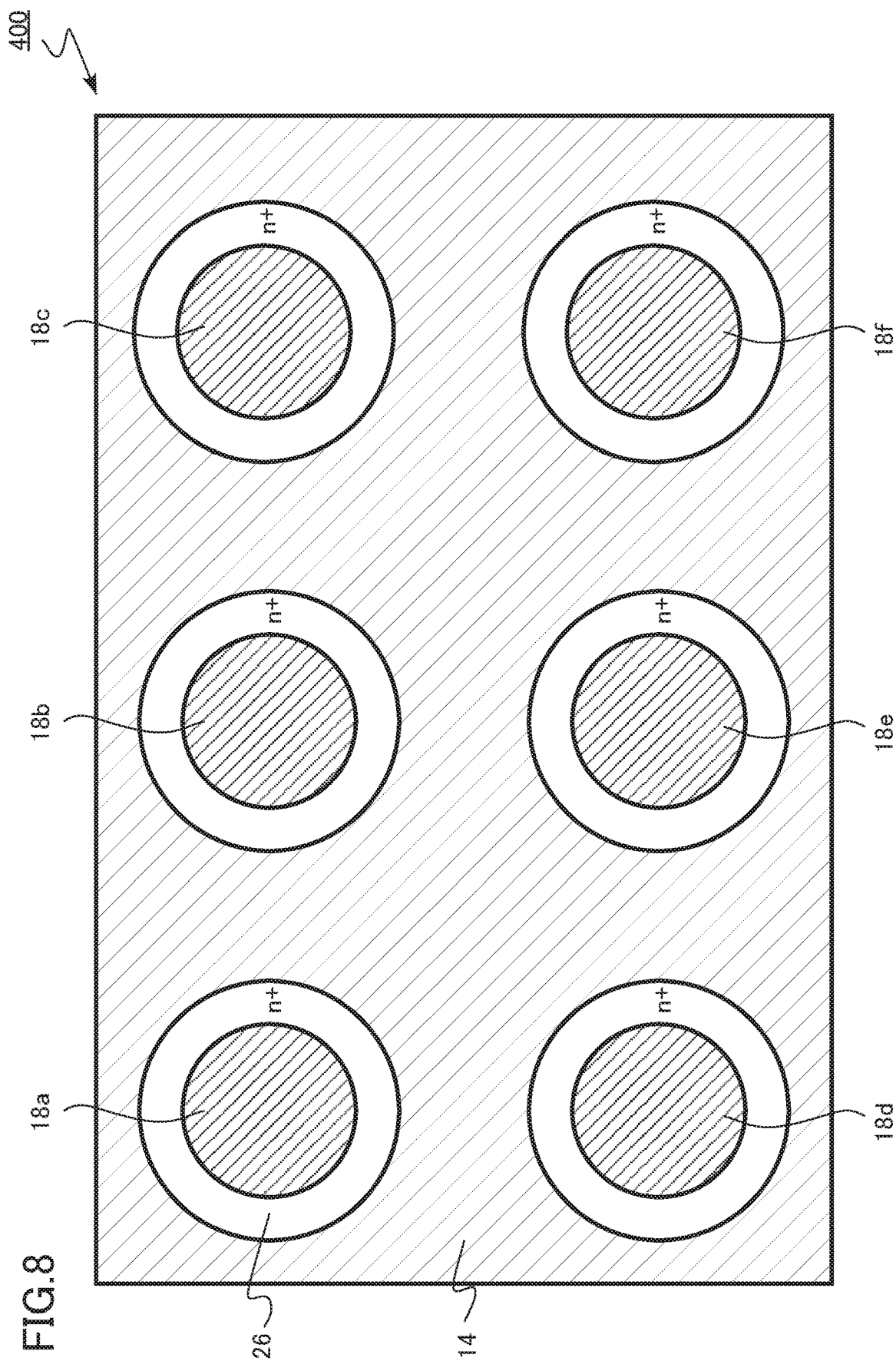
FIG. 8 is a schematic partial cross-sectional view of a semiconductor device in a fourth embodiment.

FIG. 8 is a schematic partial cross-sectional view of the semiconductor device in the fourth embodiment. FIG. 8 is a schematic partial planar view of a second plane side of the semiconductor device in the fourth embodiment.

The semiconductor device in the fourth embodiment is a planar gate-type IGBT 400 that includes a main gate electrode on the front side of a semiconductor layer. The IGBT 400 includes control gate electrodes on the back side of the semiconductor layer.

The IGBT 400 in the fourth embodiment includes a collector electrode 14, a control gate electrode 18a (second gate electrode), a control gate electrode 18b (second gate electrode), a control gate electrode 18c (second gate electrode), a control gate electrode 18d (second gate electrode), a control gate electrode 18e (second gate electrode), and a control gate electrode 18f (second gate electrode).

An n-type back-side drain region 26 (first conductivity-type region) and a collector region 28 are provided in the semiconductor layer 10.

Hereinafter, the plurality of control gate electrodes included in the IGBT 400 will be also collectively called control gate electrodes 18.

In the IGBT 400, the control gate electrode 18a, the control gate electrode 18b, the control gate electrode 18c, the control gate electrode 18d, the control gate electrode 18e, and the control gate electrode 18f are circular in shape. The circular control gate electrodes 18 are surrounded by the collector electrode 14. The back-side transistors have annular channels.

The IGBT 400 has two or more different effective gate distances, for example. In other words, the IGBT 400 has a first effective gate distance and a second effective gate distance different from the first effective gate distance.

Figure 9:
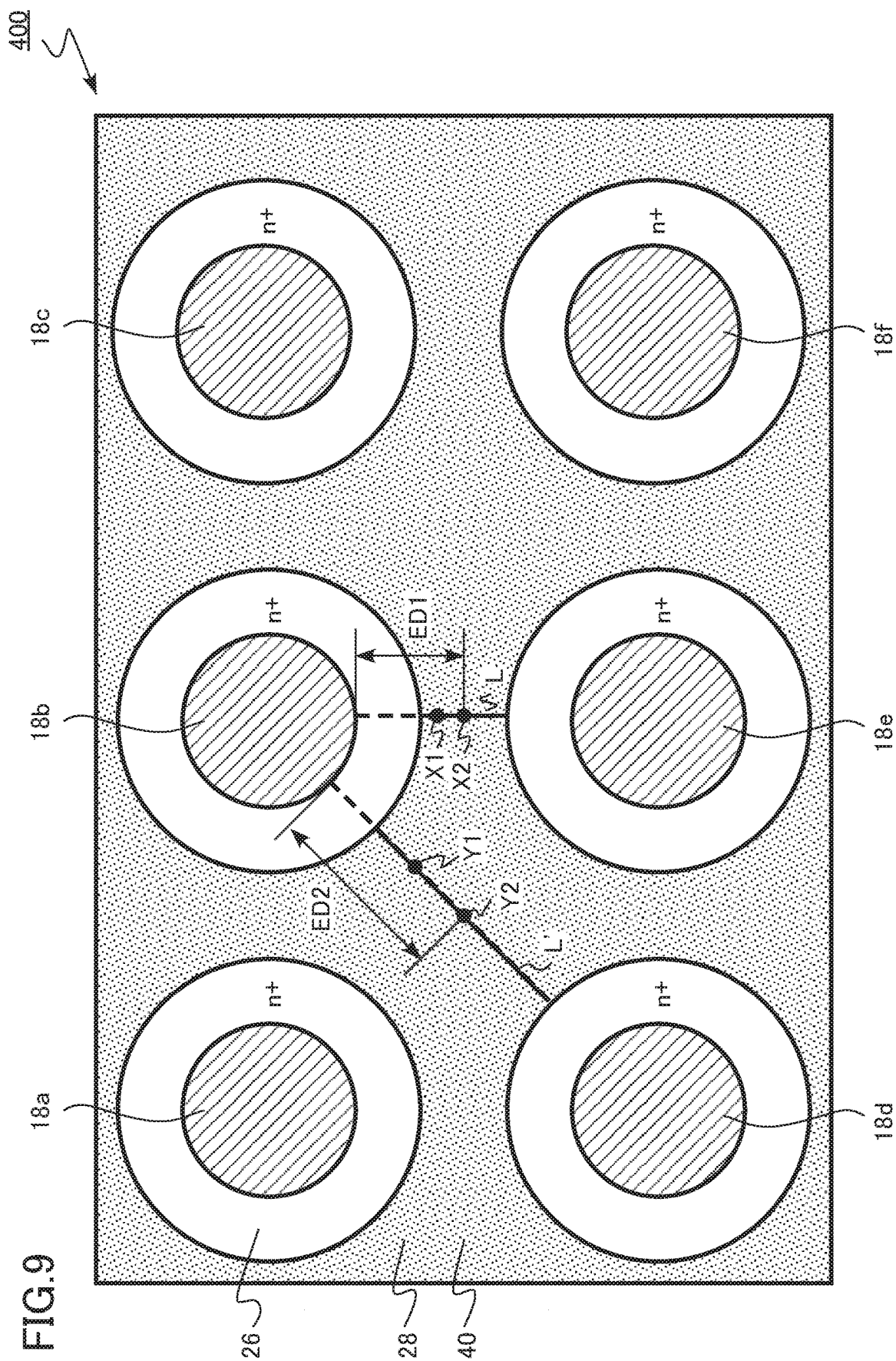
FIG. 9 is an illustrative diagram of effective gate distances of collector electrodes in the semiconductor device in the fourth embodiment.

FIG. 9 is an illustrative diagram of effective gate distances of the collector electrode in the semiconductor device in the fourth embodiment. FIG. 9 is a schematic partial planar view of a second plane side of the semiconductor device in the fourth embodiment. FIG. 9 is a planar view with the collector electrode 14 excluded from FIG. 8.

The IGBT 400 has a contact face 40. For example, the portion of contact between the collector electrode 14 and the collector region 28 constitutes the contact face 40.

For example, a first effective gate distance ED1 of the collector electrode 14 is determined as described below. A point that exists in a line segment L on the contact face 40 connecting a first point X1 positioned on the contact face 40 and the closest control gate electrode 18b and is most distant from both the control gate electrode 18b and the control gate electrode 18e is defined as a second point X2. The distance ED1 between the second point X2 and the closest control gate electrode 18b is defined as the first effective gate distance ED1. In this case, the distance between the second point X2 and the control gate electrode 18e is also equal to the distance ED1.

For example, a second effective gate distance ED2 is determined as described below. A point that exists in a line segment L' on the contact face 40 connecting a first point Y1 positioned on the contact face 40 and the closest control gate electrode 18b and is most distant from all the control gate electrode 18a, the control gate electrode 18b, the control gate electrode 18d, and the control gate electrode 18e is defined as a second point Y2. The distance ED2 between the second point Y2 and the closest control gate electrode 18b is defined as the second effective gate distance ED2 of the collector electrode 14. In this case, the distance between the second point Y2 and the control gate electrode 18a, the distance between the second point Y2 and the control gate electrode 18d, and the distance between the second point Y2 and the control gate electrode 18e are also equal to the distance ED2.

The first effective gate distance ED1 is different from the second effective gate distance ED2. The first effective gate distance ED1 is smaller than the second effective gate distance ED2.

According to the IGBT in the fourth embodiment, as with the IGBT in the first embodiment, it is possible to achieve both the reduction of a turn-off power loss of the IGBT and the suppression of occurrence of a surge voltage. In addition, it is possible to reduce the on-resistance of the IGBT.

Fifth Embodiment

A semiconductor device in a fifth embodiment is different from the first embodiment in that a buffer region has a first region positioned between a second gate electrode and a drift region and a second region positioned between a collector electrode and the drift region, and a first conductivity-type impurity concentration in the first region is higher than a first conductivity-type impurity concentration in the second region. Descriptions of features of the second embodiment overlapping those of the first embodiment may be partially omitted.

Figure 10:
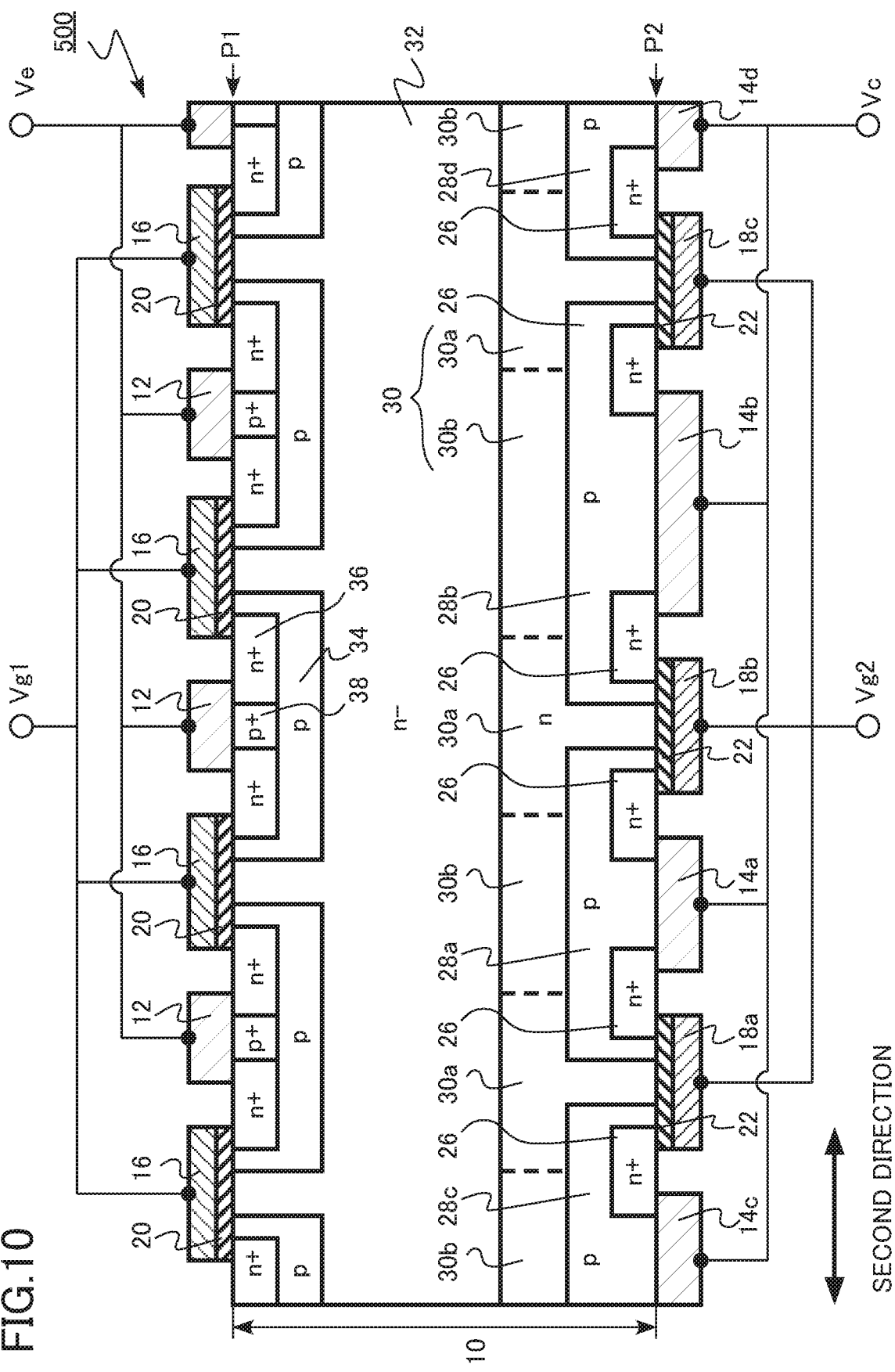
FIG. 10 is a schematic partial cross-sectional view of a semiconductor device in a fifth embodiment.

FIG. 10 is a schematic partial cross-sectional view of the semiconductor device in the fifth embodiment. Hereinafter, descriptions will be given as to a case in which the first-conductivity type is n type and the second-conductivity type is a p type as an example.

The semiconductor device in the fifth embodiment is a planar gate-type IGBT 500 that includes a main gate electrode on the front side of a semiconductor layer. The IGBT 500 includes control gate electrodes on the back side of the semiconductor layer.

The IGBT 500 in the fifth embodiment includes a semiconductor layer 10, an emitter electrode 12, a collector electrode 14a, a collector electrode 14b, a collector electrode 14c, a collector electrode 14d, a main gate electrode 16 (first gate electrode), a control gate electrode 18a (second gate electrode), a control gate electrode 18b (second gate electrode), a control gate electrode 18c (second gate electrode), a first gate insulating film 20, and a second gate insulating film 22.

Provided in the semiconductor layer 10 are an n-type back-side drain region 26 (first conductivity-type region), a p-type collector region 28a, a p-type collector region 28b, a p-type collector region 28c, a p-type collector region 28d, an n-type buffer region 30, an n$^-$-type drift region 32, a p-type base region 34, an n$^+$-type emitter region 36, and a p$^+$-type contact region 38. The buffer region 30 has a high-impurity concentration region 30a (first region) and a low-impurity concentration region 30b (second region).

Hereinafter, the plurality of collector electrodes included in the IGBT 500 will be also collectively called collector electrodes 14. Hereinafter, the plurality of control gate electrodes included in the IGBT 500 will be also collectively called control gate electrodes 18. Hereinafter, the plurality of collector regions included in the IGBT 500 will be also collectively called collector regions 28.

The n-type buffer region 30 has the high-impurity concentration region 30a and the low-impurity concentration region 30b. The high-impurity concentration region 30a is provided between the control gate electrode 18 and the drift region 32. The low-impurity concentration region 30b is provided between the collector electrode 14 and the drift region 32. The distance between the low-impurity concentration region 30b and the control gate electrode 18 is longer than the distance between the high-impurity concentration region 30a and the control gate electrode 18.

The n-type impurity concentration in the high-impurity concentration region 30a is higher than the n-type impurity concentration in the low-impurity concentration region 30b.

In the low-impurity concentration region 30b, a path is maintained for electrons to pass from the n-type buffer region 30 through the p-type collector region 28 to the collector electrode 14. Therefore, in the low-impurity concentration region 30b, the injection of holes into the n⁻-type drift region 32 is not stopped. Therefore, in the IGBT 500, the occurrence of a surge voltage is further suppressed.

According to the IGBT in the fifth embodiment, as with the IGBT in the first embodiment, it is possible to achieve both the reduction of a turn-off power loss of the IGBT and the suppression of occurrence of a surge voltage. In addition, it is possible to reduce the on-resistance of the IGBT. In addition, the occurrence of a surge voltage is more suppressed than in the IGBT in the first embodiment.

Sixth Embodiment

A semiconductor device in a sixth embodiment includes a semiconductor layer having a first plane and a second plane, the second plane being opposed to the first plane; an emitter electrode provided on a side of the first plane of the semiconductor layer; a first collector electrode provided on a side of the second plane of the semiconductor layer; a second collector electrode provided on the side of the second plane of the semiconductor layer; a first gate electrode provided on the side of the first plane of the semiconductor layer; a second gate electrode provided on the side of the second plane of the semiconductor layer; a drift region of a first conductivity-type provided in the semiconductor layer; a first collector region of a second conductivity-type provided in the semiconductor layer, the first collector region provided between a part of the drift region and the second plane, a part of the first collector region opposed to the second gate electrode, and a part of the first collector region being in contact with the first collector electrode; a first conductivity-type region of first conductivity-type provided in the semiconductor layer, the first conductivity-type region provided between a part of the first collector region and the second plane, a part of the first conductivity-type region being opposed to the second gate electrode, and a part of the first conductivity-type region being in contact with the first collector electrode; and a second collector region of the second conductivity-type provided in the semiconductor layer, the second collector region provided between a part of the drift region and the second plane, and a part of the second collector region being in contact with the second collector electrode. An entire portion of the second collector electrode in contact with the second plane is in contact with the second collector region.

Figure 11:
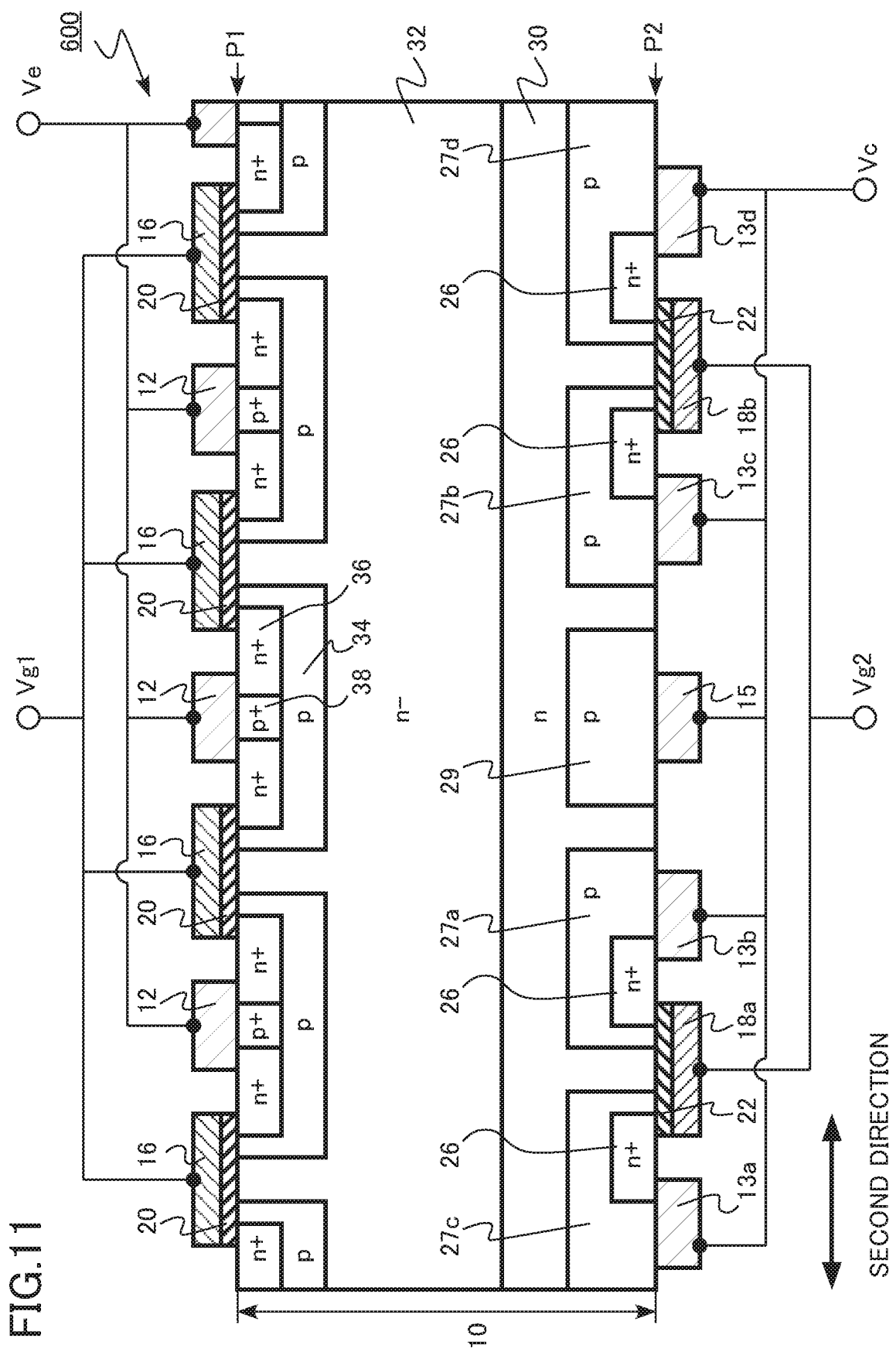
FIG. 11 is a schematic partial cross-sectional view of a semiconductor device in a sixth embodiment.

FIG. 11 is a schematic partial cross-sectional view of the semiconductor device in the sixth embodiment. Hereinafter, descriptions will be given as to a case in which the first-conductivity type is n type and the second-conductivity type is a p type as an example.

The semiconductor device in the sixth embodiment is a planar gate-type IGBT 600 that includes a main gate electrode on the front side of the semiconductor layer. The IGBT 600 includes control gate electrodes on the back side of the semiconductor layer.

The IGBT 600 in the sixth embodiment includes a semiconductor layer 10, an emitter electrode 12, a first collector electrode 13a, a first collector electrode 13b, a first collector electrode 13c, a first collector electrode 13d, a second collector electrode 15, a main gate electrode 16 (first gate electrode), a control gate electrode 18a (second gate electrode), a control gate electrode 18b (second gate electrode), a first gate insulating film 20, and a second gate insulating film 22.

Provided in the semiconductor layer 10 are an n-type back-side drain region 26 (first conductivity-type region), a p-type first collector region 27a, a p-type first collector region 27b, a p-type first collector region 27c, a p-type first collector region 27d, a p-type second collector region 29, an n-type buffer region 30, an n⁻-type drift region 32, a p-type base region 34, an n⁺-type emitter region 36, and a p⁺-type contact region 38.

Hereinafter, the plurality of first collector electrodes included in the IGBT 600 will be also collectively called first collector electrodes 13. Hereinafter, the plurality of control gate electrodes included in the IGBT 600 will be also collectively called control gate electrodes 18. Hereinafter, the plurality of first collector regions included in the IGBT 600 will be also collectively called first collector regions 27.

The semiconductor layer 10 has a first plane P1 and a second plane P2 opposed to the first plane P1. The first plane P1 constitutes the front side of the semiconductor layer 10 and the second plane P2 constitutes the back side of the semiconductor layer 10. The semiconductor layer 10 is made of a single crystal silicon, for example. The film thickness of the semiconductor layer 10 is 40 to 700 μm inclusive, for example.

The emitter electrode 12 is provided on the first plane P1 side of the semiconductor layer 10. At least a part of the emitter electrode 12 is in contact with the first plane P1 of the semiconductor layer 10. The emitter electrode 12 is made of metal, for example. An emitter voltage (Ve) may be applied to the emitter electrode 12. The emitter voltage is 0 V, for example.

The first collector electrode 13a, the first collector electrode 13b, the first collector electrode 13c, and the first collector electrode 13d are provided on the second plane P2 side of the semiconductor layer 10. At least a part of the first collector electrodes 13 are in contact with the second plane P2 of the semiconductor layer 10. The first collector electrodes 13 are made of metal, for example.

The first collector electrodes 13 are electrically connected together. A collector voltage (Vc) may be applied to the first collector electrodes 13. The collector voltage is 200 to 6500 V inclusive, for example.

The second collector electrode 15 is provided on the second plane P2 side of the semiconductor layer 10. The second collector electrode 15 is in contact with the second plane P2 of the semiconductor layer 10. The second collector electrode 15 is made of metal, for example.

The entire portion of the second collector electrode 15 in contact with the second plane P2 is in contact with the second collector region 29.

The second collector electrode 15 is electrically connected to the first collector electrodes 13. The collector voltage (Vc) may be applied to the second collector electrode 15. The collector voltage is 200 to 6500 V inclusive, for example.

The main gate electrode 16 is provided on the first plane P1 side of the semiconductor layer 10. The main gate electrode 16 is made of polycrystalline silicon including n-type impurities or p-type impurities, for example. A first gate voltage (Vg1) may be applied to the main gate electrode 16.

The first gate insulating film 20 is provided between the main gate electrode 16 and the semiconductor layer 10. The first gate insulating film 20 is a silicon oxide film, for example.

The control gate electrode 18a and the control gate electrode 18b are provided on the second plane P2 side of the semiconductor layer 10. The control gate electrodes 18a and 18b are made of polycrystalline silicon including n-type impurities or p-type impurities, for example.

The control gate electrodes 18a and 18b are electrically connected together. A second gate voltage (Vg2) is applied to the control gate electrodes 18a and 18b.

The second gate insulating film 22 is provided between the control gate electrodes 18 and the semiconductor layer 10. The second gate insulating film 22 is a silicon oxide film, for example.

The p-type first collector region 27a, the p-type first collector region 27b, the p-type first collector region 27c, and the p-type first collector region 27d are provided between a part of the drift region 32 and the second plane P2. A part of each of the first collector regions 27 is in contact with the second plane P2.

A part of each of the first collector regions 27 is opposed to one of the control gate electrodes 18 with the second gate insulating film 22 interposed between the first collector regions 27 and the control gate electrodes 18. Channels of back-side transistors controlled by the control gate electrodes 18 are formed in the first collector regions 27 opposed to the control gate electrodes 18.

The first collector regions 27 are electrically connected to the collector electrodes 13. A part of the first collector regions 27 are in contact with the collector electrodes 13.

The p-type second collector region 29 is provided between a part of the drift region 32 and the second plane P2. The second collector region 29 is in contact with the second plane P2.

The second collector region 29 is electrically connected to the second collector electrode 15. A part of the second collector region 29 is in contact with the second collector electrode 15.

The second collector region 29 may be in contact with the first collector region 27a or the first collector region 27b, for example.

The n-type back-side drain region 26 is provided between a part of each of the first collector regions 27 and the second plane P2. A part of the back-side drain region 26 is opposed to one of the control gate electrodes 18 with the second gate insulating film 22 interposed between the back-side drain region 26 and the control gate electrodes 18.

A part of the n-type back-side drain region 26 is in contact with the first collector electrodes 13. The n-type back-side drain region 26 acts as a drain of the back-side transistors.

The n-type buffer region 30 is provided between the first plane P1 and the first collector regions 27 and between the first plane P1 and the second collector region 29. The n-type buffer region 30 is provided between the drift region 32 and the second plane P2. A part of the n-type buffer region 30 is opposed to one of the control gate electrodes 18 with the second gate insulating film 22 interposed between the buffer region 30 and the control gate electrodes 18.

Th buffer region 30 has a function of suppressing the extension of the depletion layer while the IGBT 600 is in the off state. The portions of the buffer region 30 opposed to the control gate electrodes 18 act as sources of the back-side transistors. The n-type buffer region 30 may not be provided.

The n-type impurity concentration in the buffer region 30 is higher than the n-type impurity concentration in the drift region 32.

The $n^-$-type drift region 32 is provided between the buffer region 30 and the first plane P1. The n-type impurity concentration in the drift region 32 is lower than the n-type impurity concentration in the buffer region 30.

The drift region 32 constitutes a path of an on-current while the IGBT 600 is in the on state. The drift region 32 has a function of becoming depleted and maintaining the breakdown voltage of the IGBT 600 while the IGBT 600 is in the off state.

The p-type base region 34 is provided between the first plane P1 and the drift region 32. A part of the base region 34 is opposed to the main gate electrode 16 with the first gate insulating film 20 interposed between the base region 34 and the main gate electrode 16. A channel of a main transistor controlled by the main gate electrode 16 is formed in the base region 34 opposed to the main gate electrode 16.

The n-type emitter region 36 is provided between the first plane P1 and the base region 34. The emitter region 36 is electrically connected to the emitter electrode 12. A part of the emitter region 36 is in contact with the emitter electrode 12. The emitter region 36 constitutes a supply source of electrons while the IGBT 600 is in the on state.

The $p^+$-type contact region 38 is provided between the first plane P1 and the base region 34. The contact region 38 is electrically connected to the emitter electrode 12.

Next, operations of the IGBT 600 will be described.

While the IGBT 600 is in the off state, an emitter voltage (Ve) is applied to the emitter electrode 12. The emitter voltage is 0 V, for example. A collector voltage (Vc) is applied to the first collector electrodes 13 and the second collector electrode 15. The collector voltage is 200 to 6500 V inclusive, for example.

To turn on the IGBT 600, a turn-on voltage is applied as a first gate voltage (Vg1) to the main gate electrode 16. The turn-on voltage is a positive voltage that exceeds the threshold voltage of the main transistor. The turn-on voltage is 15 V, for example.

When the turn-on voltage is applied to the main gate electrode 16, an n-type inversion layer is formed in the p-type base region 34 near the interface with the first gate insulating film 20 and electrons are injected from the $n^+$-type emitter region 36 through the n-type inversion layer into the $n^-$-type drift region 32. The electrons injected into the $n^-$-type drift region 32 forwardly bias the pn junctions formed by the n-type buffer region 30 and the p-type first collector regions 27 and the second collector region 29. The electrons reach the first collector electrodes 13 and the second collector electrode 15 and cause the injection of holes from the p-type first collector regions 27. Accordingly, the IGBT 600 is turned on.

While the IGBT 600 is in the on state, the collector voltage (Vc) is applied as a second gate voltage (Vg2) to the control gate electrodes 18. Accordingly, the back-side transistors are turned off.

Next, to turn off the IGBT 600, a turn-off voltage is applied as the first gate voltage (Vg1) to the main gate electrode 16. The turn-off voltage is a voltage equal to or lower than the threshold voltage under which the main transistor is not turned on, which is 0 V, for example.

When the turn-off voltage is applied to the main gate electrode 16, the n-type inversion layer in the p-type base region 34 near the interface with the first gate insulating film 20 disappears and the injection of electrons from the $n^+$-type emitter region 36 to the $n^-$-type drift region 32 is stopped. The main transistor is turned off and the IGBT 600 moves to the off state.

Concurrently with or after a lapse of time from the application of the turn-off voltage to the main gate electrode 16, a voltage is applied as the second gate voltage (Vg2) to the control gate electrodes 18 to turn on the back-side transistors. In other words, a positive voltage equal to or higher than the threshold voltage is applied to the control gate electrodes 18 to form an n-type inversion layer in the p-type first collector regions 27 near the interface with the second gate insulating film 22.

When the n-type inversion layer is formed in the p-type first collector regions 27 near the interface with the second gate insulating film 22, there is formed a path of electrons to be passed from the n-type buffer region 30 through the n-type inversion layer and the n-type back-side drain region 26 and discharged to the first collector electrodes 13. That is, there occurs a short-circuit between the n-type buffer region 30 and the first collector electrodes 13, that is, an anode short-circuit.

The occurrence of the anode short-circuit makes it possible to prevent electrons from passing from the n-type buffer region 30 through the p-type first collector regions 27 to the first collector electrodes 13 and suppress the injection of holes from the p-type first collector regions 27 to the drift region 32. Suppressing the injection of holes at the turning off of the IGBT 600 makes it possible to reduce a tail current at the turn-off. Therefore, the turn-off time of the IGBT 600 becomes short. Accordingly, the turn-off power loss of the IGBT 600 is decreased.

Next, functions and effects of the semiconductor device in the sixth embodiment will be described.

As described above, the IGBT 600 in the sixth embodiment is provided with the back-side transistors to suppress the injection of holes into the $n^-$-type drift region 32 at the time of turn-off. Suppressing the injection of holes decreases turn-off power loss. However, completely shutting off the injection of holes may rapidly promote the depletion of the $n^-$-type drift region 32 from the second plane P2 side. In this case, punch-through may occur in the depletion layer extending from the first plane P1 side and the depletion layer extending from the second plane P2 side, generating a large surge voltage.

In the IGBT 600 in the sixth embodiment, the entire portion of the second collector electrode 15 in contact with the second plane P2 is in contact with the second collector region 29. The second collector electrode 15 is not in contact with the back-side drain region 26. The second collector electrode 15 is not provided with the adjacent control gate electrode 18.

In the region with the second collector electrode 15, a path of electrons to pass from the n-type buffer region 30 through the p-type collector region 28 and reach the collector electrode 14 is not shut off. Therefore, in this region, the injection of holes into the $n^-$-type drift region 32 is not stopped.

Leaving part of the region where holes are injected into the $n^-$-type drift region 32 suppresses the depletion of the $n^-$-type drift region 32 and the occurrence of a surge voltage. Therefore, according to the IGBT 600 in the sixth embodiment, it is possible to achieve both the reduction of a turn-off power loss and the suppression of occurrence of a surge voltage. For example, adjusting the width of the second collector electrode 15 makes it easy to achieve both the reduction of a turn-off power loss and the suppression of occurrence of a surge voltage.

Further, in the IGBT 600 in the sixth embodiment, the first collector electrodes 13 and the second collector electrode 15 are provided on not the entire surface but the partial surface of the second plane P2. Therefore, while the IGBT 600 is in the on state, it is possible to suppress passage of electrons through the first collector electrodes 13 and the second collector electrode 15 and reduce the on-resistance of the IGBT 600.

In the IGBT 600, it is preferred to, after a lapse of time from the application of the turn-off voltage to the main gate electrode 16, apply a voltage to the control gate electrodes 18 to turn on the back-side transistors. Making the temporal difference makes it possible to delay the depletion of the $n^-$-type drift region from the second plane P2 side with respect to the depletion of the $n^-$-type drift region from the first plane P1 side. Therefore, the occurrence of a surge voltage is further suppressed. From the viewpoint of suppressing the occurrence of a surge voltage, the temporal difference is preferably 100 ns or more.

As described above, according to the IGBT in the sixth embodiment, it is possible to achieve both the reduction of turn-off power loss of the IGBT and the suppression of occurrence of a surge voltage. Further, it is possible to reduce the on-resistance of the IGBT.

Seventh Embodiment

A semiconductor device in a seventh embodiment includes a semiconductor layer having a first plane and a second plane, the second plane being opposed to the first plane; an emitter electrode provided on a side of the first plane of the semiconductor layer; a collector electrode provided on a side of the second plane of the semiconductor layer, a part of the collector electrode being in contact with the second plane; a gate electrode provided on the side of the first plane of the semiconductor layer; and an insulating layer provided between the second plane and the collector electrode.

Figure 12:
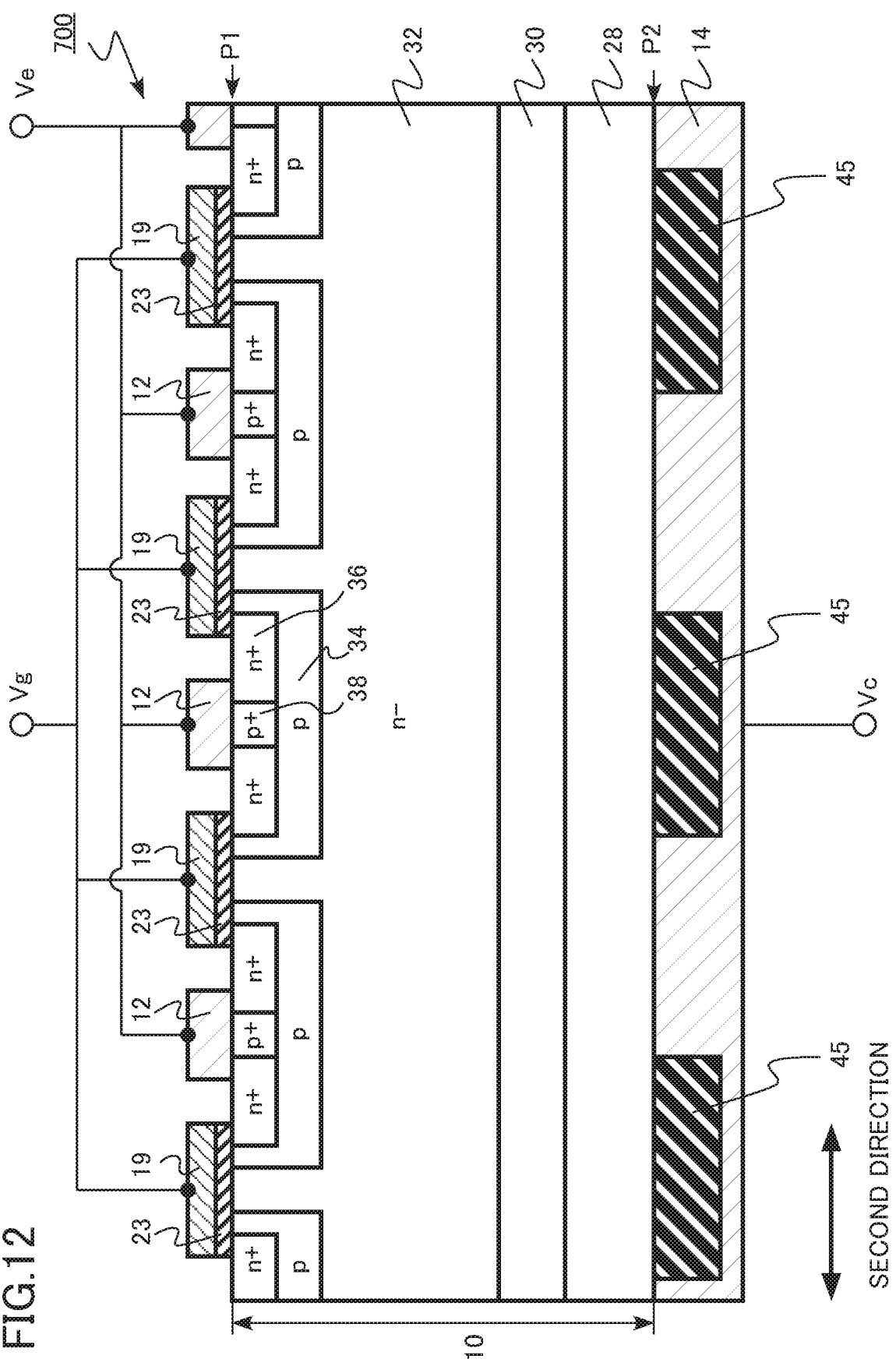
FIG. 12 is a schematic partial cross-sectional view of a semiconductor device in a seventh embodiment.

FIG. 12 is a schematic partial cross-sectional view of the semiconductor device in the seventh embodiment. Hereinafter, descriptions will be given as to a case in which the first-conductivity type is n type and the second-conductivity type is a p type as an example.

The semiconductor device in the seventh embodiment is a planar gate-type IGBT 700 that includes a gate electrode on the front side of the semiconductor layer.

The IGBT 700 in the seventh embodiment includes a semiconductor layer 10, an emitter electrode 12, a collector electrode 14, a gate electrode 19, a gate insulating film 23, and an insulating layer 45.

Provided in the semiconductor layer 10 are an n-type back-side drain region 26 (first conductivity-type region), a p-type collector region 28, an n-type buffer region 30, an $n^-$-type drift region 32, a p-type base region 34, an $n^+$-type emitter region 36, and a $p^+$-type contact region 38.

The semiconductor layer 10 has a first plane P1 and a second plane P2 opposed to the first plane P1. The first plane P1 constitutes the front side of the semiconductor layer 10 and the second plane P2 constitutes the back side of the semiconductor layer 10. The semiconductor layer 10 is made of a single crystal silicon, for example. The film thickness of the semiconductor layer 10 is 40 to 700 μm inclusive, for example.

The emitter electrode 12 is provided on the first plane P1 side of the semiconductor layer 10. At least a part of the emitter electrode 12 is in contact with the first plane P1 of the semiconductor layer 10. The emitter electrode 12 is made of metal, for example. An emitter voltage (Ve) may be applied to the emitter electrode 12. The emitter voltage is 0 V, for example.

The collector electrode 14 is provided on the second plane P2 side of the semiconductor layer 10. A part of the collector electrode 14 is in contact with the second plane P2 of the semiconductor layer 10. The collector electrode 14 is made of metal, for example.

A collector voltage (Vc) may be applied to the collector electrodes 14. The collector voltage is 200 to 6500 V inclusive, for example.

The insulating layer 45 is provided between a part of the second plane P2 and the collector electrode 14. The insulating layer 45 is made of oxide silicon, for example. The insulating layer 45 is sandwiched between a portion of the collector electrode 14 and another portion of the collector electrode 14 in a virtual plane parallel to the second plane P2.

The gate electrode 19 is provided on the first plane P1 side of the semiconductor layer 10. The gate electrode 19 is made of polycrystalline silicon including n-type impurities or p-type impurities, for example. A first gate voltage (Vg1) may be applied to the gate electrode 19.

The gate insulating film 23 is provided between the gate electrode 19 and the semiconductor layer 10. The gate insulating film 23 is made of oxide silicon, for example.

The p-type collector region 28 is provided between the drift region 32 and the second plane P2. The collector region 28 is in contact with the second plane P2.

The collector region 28 is electrically connected to the collector electrodes 14. A part of the collector region 28 is in contact with the collector electrode 14.

The n-type buffer region 30 is provided between the first plane P1 and the collector regions 28. The n-type buffer region 30 is provided between the drift region 32 and the second plane P2.

The n-type impurity concentration in the buffer region 30 is higher than the n-type impurity concentration in the drift region 32.

Th buffer region 30 has a function of suppressing the extension of the depletion layer while the IGBT 700 is in the off state. The n-type buffer region 30 may not be provided.

The n$^-$-type drift region 32 is provided between the buffer region 30 and the first plane P1. The n-type impurity concentration in the drift region 32 is lower than the n-type impurity concentration in the buffer region 30.

The drift region 32 constitutes a path of an on-current while the IGBT 700 is in the on state. The drift region 32 has a function of becoming depleted and maintaining the breakdown voltage of the IGBT 700 while the IGBT 700 is in the off state.

The p-type base region 34 is provided between the first plane P1 and the drift region 32. A part of the base region 34 is opposed to the gate electrode 19 with the gate insulating film 23 interposed between the base region 34 and the gate electrode 19. A channel of a main transistor controlled by the gate electrode 19 is formed in the base region 34 opposed to the gate electrode 19.

The n-type emitter region 36 is provided between the first plane P1 and the base region 34. The emitter region 36 is electrically connected to the emitter electrode 12. A part of the emitter region 36 is in contact with the emitter electrode 12. The emitter region 36 constitutes a supply source of electrons while the IGBT 700 is in the on state.

The p$^+$-type contact region 38 is provided between the first plane P1 and the base region 34. The contact region 38 is electrically connected to the emitter electrode 12.

Next, operations of the IGBT 700 will be described.

While the IGBT 700 is in the off state, an emitter voltage (Ve) is applied to the emitter electrode 12. The emitter voltage is 0 V, for example. A collector voltage (Vc) is applied to the collector electrodes 14. The collector voltage is 200 to 6500 V inclusive, for example.

To turn on the IGBT 700, a turn-on voltage is applied as a first gate voltage (Vg) to the gate electrode 19. The turn-on voltage is a voltage that exceeds the threshold voltage of the main transistor. The turn-on voltage is 15 V, for example.

When the turn-on voltage is applied to the gate electrode 19, an n-type inversion layer is formed in the p-type base region 34 near the interface with the gate insulating film 23 and electrons are injected from the n$^+$-type emitter region 36 through the n-type inversion layer into the n$^-$-type drift region 32. The electrons injected into the n$^-$-type drift region 32 forwardly bias pn junctions formed by the n-type buffer region 30 and the p-type collector regions 28. The electrons reach the collector electrode 14 and cause injection of holes from the p-type collector region 28, and thus the IGBT 700 is turned on.

Next, to turn off the IGBT 700, a turn-off voltage is applied as the first gate voltage (Vg) to the gate electrode 19. The turn-off voltage is a voltage equal to or lower than the threshold voltage under which the main transistor is not turned on, which is 0 V, for example.

When the turn-off voltage is applied to the gate electrode 19, the n-type inversion layer in the p-type base region 34 near the interface with the gate insulating film 23 disappears and the injection of electrons from the n$^+$-type emitter region 36 to the n$^-$-type drift region 32 is stopped. Accordingly, the IGBT 700 moves to the off state.

Next, functions and effects of the semiconductor device in the seventh embodiment will be described.

In the IGBT 700 in the seventh embodiment, the collector electrode 14 is provided on not the entire surface but the partial surface of the second plane P2. Therefore, while the IGBT 700 is in the on state, it is possible to suppress passage of electrons through the collector electrodes 14 and reduce the on-resistance of the IGBT 700.

As described above, according to the IGBT in the seventh embodiment, it is possible to reduce the on-resistance of the IGBT.

Eighth Embodiment

A semiconductor device in an eighth embodiment includes a semiconductor layer having a first plane and a second plane, the second plane being opposed to the first plane; an emitter electrode provided on a side of the first plane of the semiconductor layer; at least one collector electrode provided on a side of the second plane of the semiconductor layer; a first gate electrode provided on the side of the first plane of the semiconductor layer; at least one second gate electrode provided on the side of the second plane of the semiconductor layer; a drift region of a first conductivity-type provided in the semiconductor layer; a collector region of a second conductivity-type provided in the semiconductor layer, the collector region provided between a part of the drift region and the second plane, a part of the collector region opposed to the at least one second gate electrode, and a part of the collector region being in contact with the at least one collector electrode; and a first conductivity-type region of the first conductivity-type provided in the semiconductor layer, the first conductivity-type region provided between a part of the collector region and the second plane, a part of the first conductivity-type region being opposed to the at least one second gate electrode, and a part of the first conductivity-type region being in contact with the at least one collector electrode. When a portion of contact between the at least one collector electrode and the collector region is defined as a contact face, a point that exists in a line segment on the contact face connecting a first point positioned on the contact face and a closest second gate electrode among the at least one second gate electrode and is most distant from the at least one second gate electrode is defined as a second point, and a distance between the second point and an end of the one contact face closest to the second point is defined as an effective width, the semiconductor device has a first effective width and a second effective width different from the first effective width.

The semiconductor device in the eighth embodiment is different from the first embodiment in that, instead of the effective gate distance, the effective width is defined. Descriptions of features of the second embodiment overlapping those of the first embodiment may be partially omitted.

The semiconductor device in the eighth embodiment is a planar gate-type IGBT 800 that includes a main gate electrode on the front side of the semiconductor layer. The IGBT 800 includes control gate electrodes on the back side of the semiconductor layer. The IGBT 800 is the same in structure as the IGBT 100 in the first embodiment.

The IGBT 800 have two or more different effective widths. In other words, The IGBT 800 has a first effective width and a second effective width different from the first effective width. The effective widths are defined as described below.

The portion of contact between the collector electrode 14 and the collector region 28 is defined as a contact face. In addition, a point that exists in a line segment on the contact face connecting a first point on the contact face and the closest control gate electrode 18 (second gate electrode) and is most distant from the control gate electrode 18 is defined as a second point. In addition, the distance between the second point and the end of the contact face closest to the second point is defined as effective width.

In other words, out of points existing in the line segment, the point with the maximum value of the shortest distance to the end of the contact face is defined as the second point. The foregoing maximum value is defined as the effective width.

The second point is defined with consideration given to the distance between the second point and only the control gate electrode 18 that has a portion opposed to the collector region 28 where the first point exists.

Figure 13:
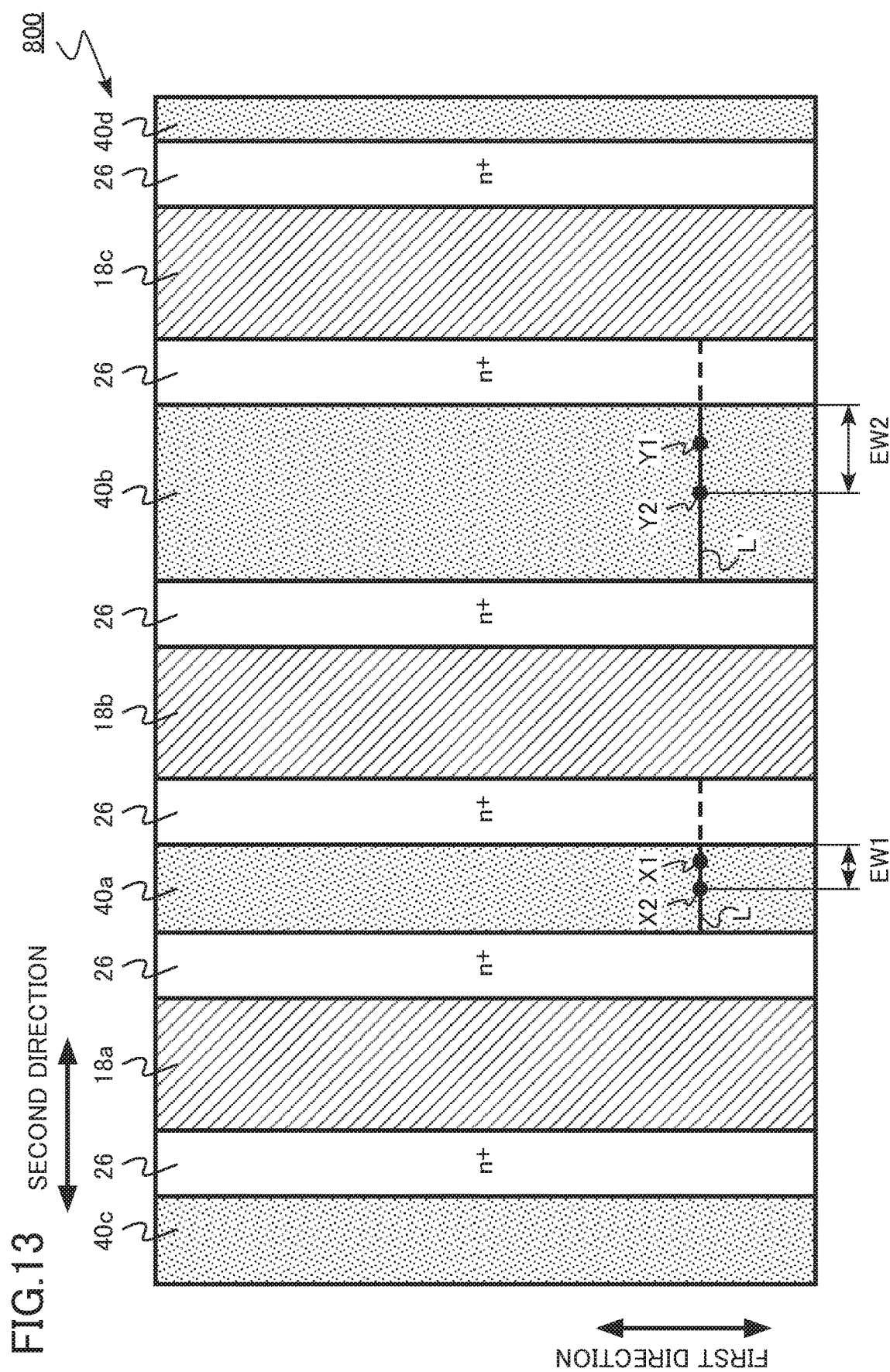
FIG. 13 is an illustrative diagram of effective widths of collector electrodes of a semiconductor device in an eighth embodiment.

FIG. 13 is an illustrative diagram of effective widths the semiconductor device in the eighth embodiment. FIG. 13 is identical to the schematic partial planar view of the second plane side of the semiconductor device in the first embodiment. FIG. 13 is identical to a planar view with the collector electrodes 14 excluded from FIG. 2.

The IGBT 800 has a contact face 40a, a contact face 40b, a contact face 40c, and a contact face 40d. For example, the portion of contact between the collector electrode 14a and the collector region 28a constitutes the contact face 40a, and the portion of contact between the collector electrode 14a and the collector region 28 constitutes the contact face 40b.

For example, an effective width EW1 is determined as described below. A point that exists in a line segment L on the contact face 40a connecting a first point X1 positioned on the contact face 40a and the closest control gate electrode 18b and is most distant from both the control gate electrode 18a and the control gate electrode 18b is defined as a second point X2. In addition, the distance EW1 between the second point X2 and the end of the contact face closest to the second point X2 is defined as effective width EW1. In this case, the distance between the second point X2 and the end of the contact face on the control gate electrode 18a side is also equal to the distance EW1.

In addition, for example, an effective width EW2 is determined as described below. A point that exists in a line segment L' on the contact face 40b connecting a first point Y1 positioned on the contact face 40b and the closest control gate electrode 18c and is most distant from the control gate electrode 18b and the control gate electrode 18c is defined as a second point Y2. In addition, the distance EW2 between the second point Y2 and the end of the contact face closest to the second point Y2 is defined as effective width EW2. In this case, the distance between the second point Y2 and the end of the contact face on the control gate electrode 18b side is also equal to the distance EW2.

The effective width EW1 is different from the effective width EW2. The effective width EW1 is shorter than the effective width EW2.

According to the IGBT in the eighth embodiment, as with the IGBT in the first embodiment, it is possible to achieve both the reduction of turn-off power loss of the IGBT and the suppression of occurrence of a surge voltage. Further, it is possible to reduce the on-resistance of the IGBT.

In the first to eighth embodiments, the semiconductor layer is made of single crystal silicon. However, the semiconductor layer is not limited to single crystal silicon. For example, the semiconductor layer may be made of any other single crystal semiconductor such as single crystal silicon carbide.

In the first to eighth embodiments, the main transistor and the back-side transistors are of a planar gate type. Alternatively, the main transistor and the back-side transistors may be of a trench gate type in which gate electrodes are provided in a trench formed in a semiconductor layer.

In the first to eighth embodiments, the first-conductivity type is n type and the second-conductivity type is p type. Alternatively, the first-conductivity type may be p type and the second-conductivity type may be n type.

While certain embodiments have been described, these embodiments have been presented by way of example only, and are not intended to limit the scope of the inventions. Indeed, the semiconductor devices described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a semiconductor layer having a first plane and a second plane, the second plane being opposed to the first plane;
an emitter electrode provided on a side of the first plane of the semiconductor layer;
at least one collector electrode provided on a side of the second plane of the semiconductor layer, the at least one collector electrode including a first portion having a first width and a second portion having a second width, and the first width is smaller than the second width;
a first gate electrode provided on the side of the first plane of the semiconductor layer;
at least one second gate electrode provided on the side of the second plane of the semiconductor layer, the at least one second gate electrode provided between the first portion and the second portion;
a drift region of a first conductivity-type provided in the semiconductor layer;
a collector region of a second conductivity-type provided in the semiconductor layer, the collector region provided between a part of the drift region and the second plane, a first part of the collector region opposed to the at least one second gate electrode, the first part of the collector region being in contact with the second plane, and a second part of the collector region being in contact with the at least one collector electrode; and
a plurality of first conductivity-type regions of the first conductivity-type provided in the semiconductor layer, the plurality of first conductivity-type regions provided between a third part of the collector region and the second plane, a first part of each of the plurality of first conductivity-type regions being opposed to the at least one second gate electrode, the first part of each of the plurality of first conductivity-type regions being in contact with the second plane, and a second part of each of the plurality of first conductivity-type regions being in contact with the at least one collector electrode,
wherein a first set of first conductivity-type regions of the plurality first conductivity-type regions being in contact with the first portion is separated by a first distance, a second set of first conductivity-type regions of the plurality first conductivity-type regions being in contact with the second portion is separated by a second distance greater than the first distance,
wherein
a third distance between the first plane and the at least one second gate electrode in a direction perpendicular to the first plane is larger than a fourth distance between the first plane and the at least one collector electrode in the direction, and
the first portion and the second portion are electrically connected.

2. The semiconductor device according to claim 1, further comprising a buffer region of the first conductivity-type provided between the drift region and the second plane, a first conductivity-type impurity concentration of the buffer region being higher than a first conductivity-type impurity concentration of the drift region.

3. The semiconductor device according to claim 2, wherein the buffer region has a first region positioned between the at least one second gate electrode and the drift region and a second region positioned between the at least one collector electrode and the drift region, and a first conductivity-type impurity concentration of the first region is higher than a first conductivity-type impurity concentration of the second region.

4. The semiconductor device according to claim 1, wherein, the at least one collector electrode is a plurality of collector electrodes, the at least one second gate electrode is a plurality of second gate electrodes, the plurality of collector electrodes and the plurality of second gate electrodes are alternately disposed on a cross section perpendicular to the second plane, the first portion corresponds to one of the plurality of collector electrodes, and the second portion corresponds to another of the plurality of collector electrodes.

5. The semiconductor device according to claim 1, wherein, at a time of a shift from an on state in which a voltage equal to or higher than a threshold voltage is applied to the first gate electrode to an off state in which a voltage lower than the threshold voltage is applied to the first gate electrode, after a lapse of time from application of the voltage lower than the threshold voltage to the first gate electrode, a voltage equal to or higher than the threshold voltage is applied to the at least one second gate electrode.

6. The semiconductor device according to claim 1, wherein the first portion and the second portion extend in a first direction parallel to the second plane, and the first width and the second width are widths in a second direction parallel to the second plane and perpendicular to the first direction.

7. The semiconductor device according to claim 1, wherein the first width is a minimum distance between two edges of the first portion and the second width is a minimum distance between two edges of the second portion.

* * * * *